(12) United States Patent
Shoji et al.

(10) Patent No.: US 7,425,727 B2
(45) Date of Patent: Sep. 16, 2008

(54) OPTICAL SEMICONDUCTOR DEVICE, METHOD FOR FABRICATING THE SAME, LEAD FRAME AND ELECTRONIC EQUIPMENT

(75) Inventors: Hiroyuki Shoji, Katsuragi (JP); Hideya Takakura, Nara-ken (JP); Kazuo Kusuda, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/226,434

(22) Filed: Sep. 15, 2005

(65) Prior Publication Data

US 2006/0054901 A1    Mar. 16, 2006

(30) Foreign Application Priority Data

| Sep. 16, 2004 | (JP) | ............... P2004-269470 |
| Feb. 24, 2005 | (JP) | ............... P2005-048556 |
| Apr. 6, 2005 | (JP) | ............... P2005-109735 |
| Jul. 22, 2005 | (JP) | ............... P2005-213184 |

(51) Int. Cl.
    H01L 21/00 (2006.01)
(52) U.S. Cl. ............... 257/82; 257/100; 257/433
(58) Field of Classification Search ............... 257/433, 257/92, 80, 100; 385/92
    See application file for complete search history.

(56) References Cited

U.S. PATENT DOCUMENTS

| 5,300,459 | A * | 4/1994 | Ushikubo et al. ............ 438/126 |
| 6,144,108 | A * | 11/2000 | Ohizumi et al. ............ 257/793 |
| 6,170,996 | B1 |  1/2001 | Miura et al. |

| 2002/0088985 | A1 |  7/2002 | Komoto et al. |
| 2002/0145152 | A1 * | 10/2002 | Shimomura ............ 257/98 |

FOREIGN PATENT DOCUMENTS

| EP | 0397426 | 11/1990 |
| JP | 63014457 | 1/1988 |
| JP | 2152285 | 6/1990 |
| JP | 3072641 | 3/1991 |
| JP | 3-183139 A | 8/1991 |
| JP | 4-92459 A | 3/1992 |
| JP | 5006946 | 1/1993 |
| JP | 7111342 | 4/1995 |
| JP | 9027573 | 1/1997 |
| JP | 9051011 | 2/1997 |
| JP | 10056238 | 2/1998 |
| JP | 10512399 | 11/1998 |
| JP | 2000-173947 A | 6/2000 |
| JP | 2000340846 | 12/2000 |
| JP | 2001168398 | 6/2001 |
| JP | 2002076445 | 3/2002 |
| JP | 2002319709 | 10/2002 |
| JP | 2003277473 | 10/2003 |
| JP | 2004-172477 A | 6/2004 |
| JP | 2005-142314 A | 6/2005 |

* cited by examiner

*Primary Examiner*—Leonardo Andújar
(74) *Attorney, Agent, or Firm*—Birch, Stewart, Kolasch & Birch, LLP

(57) ABSTRACT

An optical semiconductor element 2 is mounted on a lead frame 1, the optical semiconductor element 2 is encapsulated with a mold resin portion 14 of a first layer that has light permeability, and the mold resin portion 14 of the first layer is encapsulated with a mold resin portion 15 of a second layer that has light permeability. Then, a coefficient of linear expansion of the mold resin portion 14 of the first layer is made smaller than a coefficient of linear expansion of the mold resin portion 15 of the second layer.

10 Claims, 31 Drawing Sheets

PRIMARY TIE BAR CUTTING
PROCESS

SECONDARY MOLDING
PROCESS

SECOND GATE
MEMBER CUTTING
PROCESS

FIN PROVIDED ON ONE SIDE

FINS PROVIDED ON BOTH SIDES

OPTICAL SEMICONDUCTOR DEVICE, METHOD FOR FABRICATING THE SAME, LEAD FRAME AND ELECTRONIC EQUIPMENT

This nonprovisional application claims priority under 35 U.S.C. §119(a) on Patent Application No. 2004-269470 filed in Japan on Sep. 16, 2004, patent application No. 2005-048556 filed in Japan on Feb. 24, 2005, patent application No. 2005-109735 filed in Japan on Apr. 6, 2005 and patent application No. 2005-213184 filed in Japan on Jul. 22, 2005, the entire contents of which are hereby incorporated by reference.

BACKGROUND OF THE INVENTION

The present invention relates to optical semiconductor devices that have optical semiconductor elements and relates, in particular, to an optical semiconductor device which can be utilized for an optical communication device that transmits and receives optical signals by means of an optical transmission medium of an optical fiber or the like.

The optical semiconductor device of the present invention is used for electronic equipment such as digital TV (Television) sets, digital BS (Broadcasting Satellite) tuners, CS (Communication Satellite) tuners, DVD (Digital Versatile Disc) players, CD (Compact Disc) players, AV (Audio Visual) amplifiers, audio devices, personal computers (hereinafter referred to as PC's), personal computer peripherals, portable telephones and PDA (Personal Digital Assistant) devices. Moreover, the optical semiconductor device can also be used for electronic equipment such as automobile onboard equipment of car audio devices, car navigation devices and sensors, sensors of robots in factories and control equipment, the equipment used in environments of wide operating temperature ranges.

An optical semiconductor device that connects optical semiconductor elements of a light-emitting diode (LED) and a photodiode (PD) with an optical fiber cable has conventionally been known and used for optical communications between devices and in homes and automobiles.

As these optical semiconductor devices, as shown in FIG. 31, those which are fabricated by utilizing transfer molding with a transparent resin are widely used. In the optical semiconductor device shown in FIG. 31, an optical semiconductor element 102 bonded onto a lead frame 101 with a conductive adhesive paste 103 is encapsulated with a transparent resin 106, and the optical semiconductor element 102 and the optical fiber cable 111 are optically connected with each other by a lens 110 formed of the translucent resin. The optical semiconductor element 102 is electrically connected to the lead frame 101 by a wire 104. Moreover, an integrated circuit chip 105 for controlling the driving of the optical semiconductor element 102 is mounted bonded onto the lead frame 101 with the conductive adhesive paste 103.

In general, the transparent resin used for an optical semiconductor device as described above has had a problem that the coefficient of linear expansion thereof has been increased by the use of the transparent resin filled with no filler making great account of the optical characteristics, which has led to a problem in the environmental resistance (thermal shock resistance, heat dissipation and so on).

Therefore, an optical semiconductor device (shown in FIG. 32), which can be encapsulated with a mold resin filled with filler by devising the construction of the optical semiconductor device, is disclosed (refer to, for example, JP 2000-173947 A). In the optical semiconductor device shown in FIG. 32, a glass lens 212 is stuck to only the optical part of an optical semiconductor element 202, the element is mounted on a lead frame 201 with a conductive adhesive paste 203, and an electrode located at the periphery of the optical part of the optical semiconductor element 202 is electrically connected to the lead frame 201 via a wire 204. Subsequently, by transfer forming with a mold resin filled with filler, the optical semiconductor element 202 and the wire 203 can be encapsulated with a mold resin portion 207 without shielding an optical path through which light enters and goes out of the optical semiconductor element 202.

Moreover, as a semiconductor device resin encapsulating technique, as shown in FIG. 33, a resin encapsulating technique for providing a first encapsulating resin portion 308 that integrally encapsulates the main body constituents including a lead frame 301, a semiconductor element 302 bonded onto the lead frame 301 with a conductive adhesive paste 303 and a bonding wire 304 that connects these members, and a second encapsulating resin portion 309 that is formed to cover at least part of the outer peripheral portion of the first encapsulating resin portion 308 and selecting the first and second encapsulating resin portions 308 and 309 so that the coefficient of linear expansion of the second encapsulating resin portion 309 is made smaller than the coefficient of linear expansion of the first encapsulating resin portion 308 is also disclosed (refer to, for example, JP 04-92459 A).

Since the conventional optical semiconductor device is fabricated by transfer molding with the transparent resin filled with no filler, there are great differences in the coefficient of linear expansion among the transparent resin, the lead frame, the optical semiconductor element and the bonding wire, and this leads to a problem that the troubles of wire disconnection, package cracking and so on occur due to thermal stresses. There is a further problem that the transparent resin has a thermal conductivity of about 0.17 W/m·K, which is much smaller than that of a metal (e.g., a copper material has a thermal conductivity of 365 W/m·K), and this makes it difficult to dissipate heat generated in the optical semiconductor element, limiting the operating range at high temperature. Due to the problems, it is very difficult to fabricate a highly reliable optical semiconductor device.

Moreover, it is known that the coefficient of linear expansion and the thermal conductivity can be adjusted by filling the mold resin with filler. However, since it is difficult to achieve filling of filler (or it is permissible to achieve filling of filler only by a small amount) due to a reduction in the light transmittance in the optical semiconductor device of which the optical characteristics are valued, there has been a problem in fabricating a highly reliable optical semiconductor device. Therefore, in order to use a mold resin filled with filler, as shown in FIG. 32, a structure in which a glass lens is mounted in the light-receiving portion of an optical semiconductor element and the lens is partially peripherally encapsulated with a resin, can be considered. However, actually in this structure, a glass lens can be placed in the optical part when an optical semiconductor element of a comparatively large size (several millimeters to several tens of millimeters square) as in a CCD. In contrast to this, in an optical semiconductor element of a small size (several hundreds of micrometers square) as in an LED, a very small glass lens needs to be used since the optical part is very small, and there are the problems that:

(i) it is difficult to fabricate a minute glass lens;

(ii) it is difficult to achieve mutual bonding and alignment between the optical part and the glass lens; and (iii) interfacial separation occurs due to a difference in the coefficient of linear expansion between the glass and the mold resin due to thermal stresses.

Moreover, there is a problem that the wire bonding cannot be carried out when a glass lens that is larger than the optical part of the optical semiconductor element is employed since the glass lens overlaps the electrode located adjacent to the optical part of the optical semiconductor element. Moreover, another method for a structure in which a semiconductor device electrically connected to a lead frame with a bonding wire is covered a first encapsulating resin, and the peripheral portion of the first encapsulating resin is further covered with a second encapsulating resin, as disclosed in FIG. 33, by which the coefficient of linear expansion of the second encapsulating resin is made smaller than the coefficient of linear expansion of the first encapsulating resin to reduce the separation between the encapsulating resins due to thermal stresses, is also considered. However, since the coefficient of linear expansion of the first encapsulating resin is greater than the coefficient of linear expansion of the second encapsulating resin, there occurs a problem that the first encapsulating resin is formed in a swelled state due to heat at the time of forming the second encapsulating resin, and the contraction of the first encapsulating resin becomes greater than that of the second encapsulating resin at the time of cooling after the formation, causing separation at the resin interface and reducing the reliability of the moisture resistance and so on.

SUMMARY OF THE INVENTION

An object of the present invention is to provide a compact inexpensive optical semiconductor device, which can employ a semiconductor optical element of a small chip size of LED, PD or the like and has a satisfactory optical transmission quality and a high reliability, and a method for fabricating the optical semiconductor device.

Another object of the present invention is to provide a lead frame, which is able to prevent the occurrence of resin flash at the outer terminals, fin portions and so on and does not convolve a primary resin in a secondary mold portion even in the case of a package that does not permit resin encapsulating of a through gate type or the like and a method for fabricating an optical semiconductor device that employs the lead frame and has satisfactory characteristics.

Another object of the present invention is to provide electronic equipment that employs the optical semiconductor device and has high performance and a high reliability.

In order to achieve the objects, the optical semiconductor device of the present invention includes:
a lead frame;
an optical semiconductor element placed on the lead frame;
a first mold resin portion that encapsulates the optical semiconductor element; and
a second mold resin portion that has light permeability and encapsulates at least part of the first mold resin portion, wherein
the first mold resin portion has a coefficient of linear expansion made smaller than a coefficient of linear expansion of the second mold resin portion.

According to the optical semiconductor device of the construction, by making the coefficient of linear expansion of the first mold resin portion smaller than the coefficient of linear expansion of the second mold resin portion, the difference in the coefficient of linear expansion between the first mold resin portion and the lead frame and the optical semiconductor element can be reduced. With this arrangement, the disconnection of the bonding wire, the package cracking and so on due to thermal stresses do not occur, and therefore, an optical semiconductor device, which has a high reliability and a satisfactory optical transmission quality, can be fabricated compactly at low cost.

Moreover, in the optical semiconductor device of one embodiment, the first mold resin portion has light permeability.

Moreover, in the optical semiconductor device of one embodiment, the first mold resin portion has a transmissivity smaller than a transmissivity of the second mold resin portion.

According to the optical semiconductor device of the embodiment, the transmissivity of the first mold resin portion is smaller than the transmissivity of the second mold resin portion, and therefore, the diffraction of the external disturbance light at the first mold resin portion can be reduced, and the signal-to-noise ratio can be improved. Moreover, the scattering of light in the first mold resin portion can be reduced, and the efficiency of reception or transmission can be improved.

Moreover, in the optical semiconductor device of one embodiment, a mold resin filled with filler is used for the first mold resin portion, and a difference between a coefficient of linear expansion of the lead frame and a coefficient of linear expansion of the first mold resin portion is set to 0 to $6.0 \times 10^{-5}$.

According to the optical semiconductor device of the embodiment, by setting the difference between the coefficient of linear expansion of the lead frame and the coefficient of linear expansion of the first mold resin portion to 0 to $6.0 \times 10^{-5}$, an optical semiconductor device, which is able to reduce the troubles of the disconnection of the bonding wire, the chip separation and so on caused by the separation between the lead frame and the mold resin due to thermal stresses and has a higher reliability can be fabricated.

Moreover, in the optical semiconductor device of one embodiment, a difference between a coefficient of linear expansion of the first mold resin portion and a coefficient of linear expansion of the second mold resin portion is set to 0 to $6.0 \times 10^{-5}$.

According to the optical semiconductor device of the embodiment, an optical semiconductor device, which is able to reduce the troubles of the moisture resistance and so on ascribed to the resin interface separation due to a difference in the thermal contraction between the first mold resin portion and the second mold resin portion and has a high reliability can be fabricated.

Moreover, in the optical semiconductor device of one embodiment, a phenolic curing epoxy resin or an acid anhydride curing epoxy resin is used for the first mold resin portion and the second mold resin portion. In this case, a "phenolic curing epoxy resin" means a curing epoxy resin that contains a phenolic compound, and an "acid anhydride curing epoxy resin" means a curing epoxy resin that uses acid anhydride as a curing agent.

According to the optical semiconductor device of the embodiment, an optical semiconductor device, which is able to easily control the coefficient of linear expansion, the thermal conductivity and the transmissivity by using the phenolic curing epoxy resin or the acid anhydride curing epoxy resin for the first mold resin portion and the second mold resin portion and has a satisfactory optical transmission quality and a high reliability, can be fabricated compactly at low cost.

Moreover, in the optical semiconductor device of one embodiment, a phenolic curing epoxy resin filled with transparent filler is used for the first mold resin portion, and an acid anhydride curing epoxy resin is used for the second mold resin portion.

According to the optical semiconductor device of the embodiment, an optical semiconductor device, which has a satisfactory optical transmission quality and a high reliability by using the phenolic curing epoxy resin filled with transparent filler for the first mold resin portion and using the acid anhydride curing epoxy resin for the second mold resin portion, can be fabricated compactly at low cost.

Moreover, in the optical semiconductor device of one embodiment, an acid anhydride curing epoxy resin filled with transparent filler is used for the second mold resin portion.

According to the optical semiconductor device of the embodiment, an optical semiconductor device, which is able to reduce the difference in the coefficient of linear expansion between the first mold resin portion and the second mold resin portion and reduce the troubles of moisture resistance and so on caused by the resin interface separation due to thermal stresses by using the acid anhydride curing epoxy resin filled with transparent filler for the second mold resin portion and has a higher reliability, can be fabricated.

Moreover, in the optical semiconductor device of one embodiment, a phenolic curing epoxy resin filled with transparent filler is used for the first mold resin portion, and a phenolic curing epoxy resin filled with transparent filler of a loading weight smaller than that of the first mold resin portion is used for the second mold resin portion.

According to the optical semiconductor device of the embodiment, an optical semiconductor device, which is able to further reduce the difference in the coefficient of linear expansion between the first mold resin portion and the second mold resin portion and reduce the occurrence of resin interface separation due to thermal stresses by using the phenolic curing epoxy resin of which the loading weight of transparent filler is smaller than that of the first mold resin portion for the second mold resin portion, shorten the encapsulating time since the phenolic curing epoxy resin of the first and second mold resin portions has a curability faster than that of acid anhydride curing epoxy resin and has a high reliability, can be fabricated at low cost.

Moreover, in the optical semiconductor device of one embodiment, an acid anhydride curing epoxy resin filled with transparent filler is used for the first mold resin portion, and an acid anhydride curing epoxy resin filled with no filler is used for the second mold resin portion.

According to the optical semiconductor device of the embodiment, an optical semiconductor device, which has a more satisfactory optical transmission quality and a high reliability by using the acid anhydride curing epoxy resin filled with transparent filler for the first mold resin portion and using the acid anhydride curing epoxy resin filled with no filler for the second mold resin portion, can be fabricated compactly at low cost.

Moreover, in the optical semiconductor device of one embodiment, an acid anhydride curing epoxy resin filled with transparent filler is used for the first mold resin portion and the second mold resin portion.

According to the optical semiconductor device of the embodiment, an optical semiconductor device, which is able to reduce the difference in the coefficient of linear expansion between the first mold resin portion and the second mold resin portion and reduce the troubles of the moisture resistance and so on caused by resin interface separation due to thermal stresses by using the acid anhydride curing epoxy resin filled with transparent filler for the first mold resin portion and using the acid anhydride curing epoxy resin filled with transparent filler for the second mold resin portion and has a higher reliability, can be fabricated.

Moreover, in the optical semiconductor device of one embodiment, an acid anhydride curing epoxy resin filled with transparent filler is used for the first mold resin portion, and a phenolic curing epoxy resin filled with transparent filler of a loading weight smaller than that of the first mold resin portion is used for the second mold resin portion.

According to the optical semiconductor device of the embodiment, an optical semiconductor device, which is able to reduce the difference in the coefficient of linear expansion between the first mold resin portion and the second mold resin portion and reduce the occurrence of resin interface separation due to thermal stresses by using the phenolic curing epoxy resin of which the loading weight of transparent filler is smaller than that of the first mold resin portion for the second mold resin portion, shorten the encapsulating time since the phenolic curing epoxy resin of the first and second mold resin portions has a curability faster than that of acid anhydride curing epoxy resin and has a high reliability, can be fabricated at low cost.

Moreover, in the optical semiconductor device of one embodiment, a phenolic curing epoxy resin filled with transparent filler or an acid anhydride curing epoxy resin filled with transparent filler is used for the first mold resin portion, and the first mold resin portion is filled with transparent filler of a loading weight of 20 to 80 percent by weight.

According to the optical semiconductor device of the embodiment, an optical semiconductor device, which is able to reduce the coefficient of linear expansion of the first mold resin portion with a high transmissivity maintained and increase the thermal conductivity by making the mold resin have a transparent filler loading weight set to 20 to 80 wt % and has a satisfactory optical transmission quality and a high reliability, can be fabricated compactly at low cost.

Moreover, in the optical semiconductor device of one embodiment, a phenolic curing epoxy resin filled with transparent filler or an acid anhydride curing epoxy resin filled with transparent filler is used for the first mold resin portion, and the transparent filler has a refractive index about equal to a refractive index of the phenolic curing epoxy resin or the acid anhydride curing epoxy resin.

According to the optical semiconductor device of the embodiment, since the refractive index of the transparent filler is about equal to the refractive index of the epoxy resin to be filled with the filler, an optical semiconductor device, which is able to reduce the attenuation of the optical signal due to scattering in the mold resin and has a more satisfactory optical transmission quality, can be fabricated.

Moreover, in the optical semiconductor device of one embodiment, a phenolic curing epoxy resin filled with transparent filler or an acid anhydride curing epoxy resin filled with transparent filler is used for the first mold resin portion, and the transparent filler has a spherical shape.

According to the optical semiconductor device of the embodiment, an optical semiconductor device, which is able to stabilize the optical signal transmission path by the spherical transparent filler and reduce the stress damage (filler attack) to the optical semiconductor element due to the filler and has a satisfactory optical transmission quality and a high reliability, can be fabricated. Moreover, the grain size of the spherical shape filler may preferably be uniformed.

Moreover, in the optical semiconductor device of one embodiment, at least one of the first mold resin portion and the second mold resin portion contains a dyestuff that cuts off light having a shorter wavelength than a light reception wavelength or emission wavelength of the optical semiconductor element.

According to the optical semiconductor device of the embodiment, an optical semiconductor device, which is able to reduce optical noises from the outside by the dyestuff contained in at least one of the first and second encapsulating mold resins and has a satisfactory optical transmission quality free from malfunction, can be fabricated at low cost.

Moreover, in the optical semiconductor device of one embodiment, a phenolic curing epoxy resin filled with transparent filler or an acid anhydride curing epoxy resin filled with transparent filler is used for the first mold resin portion, and the first mold resin portion has a thickness made thinner than that of the other portion thereof above a portion that carries out at least one of light reception or light emission of the optical semiconductor element.

According to the optical semiconductor device of the embodiment, an optical semiconductor device, which is able to reduce the scattering of light due to the filler in the first mold resin portion by shortening the path through which the optical signal passes in the first mold resin portion with the thickness of the first mold resin portion made smaller than that of the other portion and has a satisfactory optical transmission quality and a high reliability, can be fabricated at low cost.

Moreover, in the optical semiconductor device of one embodiment, a recess is formed in the first mold resin portion above the portion that carries out at least one of light reception or light emission of the optical semiconductor element, and a taper for collecting light is formed on a sidewall of the recess.

According to the optical semiconductor device of the embodiment, an optical semiconductor device, which is able to efficiently collect transmission light or reception light by the taper for collecting light provided on the sidewall of the recess of the first mold resin portion and has a more satisfactory optical transmission quality, can be fabricated at low cost.

Moreover, in the optical semiconductor device of one embodiment, the device includes a silicone resin portion that has cold resistance and is provided to cover the optical semiconductor element, and the optical semiconductor element covered with the silicone resin is encapsulated with at least the second mold resin portion out of the first mold resin portion and the second mold resin portion.

According to the optical semiconductor device of the embodiment, an optical semiconductor device, which is able to reduce the stress applied to the bonding wire at low temperature by covering the optical semiconductor element with the silicone resin that has cold resistance and has a high reliability, can be fabricated.

Moreover, in the optical semiconductor device of one embodiment, the silicone resin portion has a portion which is located above the portion that carries out light reception or light emission of the optical semiconductor element and is not encapsulated with the first mold resin portion but encapsulated with the second mold resin portion.

According to the optical semiconductor device of the embodiment, an optical semiconductor device, which causes no scattering of the optical signal in the first mold resin portion since the optical signal does not pass through the inside of the first mold resin portion and has a satisfactory optical transmission quality, can be fabricated at low cost.

Moreover, in the optical semiconductor device of one embodiment, the silicone resin portion has a transmissivity greater than a transmissivity of the first mold resin portion and a transmissivity of the second mold resin portion.

According to the optical semiconductor device of the embodiment, the transmissivity of the silicone resin portion is greater than the transmissivity of the first mold resin portion and the transmissivity of the second mold resin portion. Therefore, the silicone resin portion is superior in light permeability to the first mold resin portion and the second mold resin portion and able to reduce the loss of the quantity of light.

Moreover, in the optical semiconductor device of one embodiment, the lead frame and the optical semiconductor element are mutually electrically connected via a wire having a low loop configuration.

According to the optical semiconductor device of the embodiment, the lead frame and the optical semiconductor element are mutually electrically connected via the wire having a low loop configuration, and therefore, the rise of the wire in the vertical direction with respect to the lead frame can be reduced in the silicone resin portion. Therefore, by holding down the silicone resin portion by the metal mold for the formation of the first mold resin portion in the fabricating stage of the optical semiconductor device, and the buckling of the wire can be prevented even if a stress is applied to the silicone resin portion.

Moreover, in the optical semiconductor device of one embodiment, the wire has a parallel portion that extends from a bump portion located on the optical semiconductor element and is about parallel to the lead frame.

According to the optical semiconductor device of the embodiment, the wire has the parallel portion that extends from the bump portion located on the optical semiconductor element and is about parallel to the lead frame. Therefore, the wire can reliably be connected to the optical semiconductor element, and the wire of a small rise can easily be formed.

Moreover, in the optical semiconductor device of one embodiment, the wire includes:

a ball portion located on the optical semiconductor element;

a bent portion extending from the ball portion; and a parallel portion that extends from the bent portion and is about parallel to the lead frame.

According to the optical semiconductor device of the embodiment, the wire has the ball portion located on the optical semiconductor element, the bent portion that extends from the ball portion and the parallel portion that extends from the bent portion and is about parallel to the lead frame. Therefore, the wire, which can reliably be connected to the optical semiconductor element and has a small rise, can easily be formed.

Moreover, in the optical semiconductor device of one embodiment, a height of the bent portion from the optical semiconductor element is lower than a height of the parallel portion from the optical semiconductor element.

According to the optical semiconductor device of the embodiment, the height of the bent portion from the optical semiconductor element is lower than the height of the parallel portion from the optical semiconductor element. Therefore, the rise of the bent portion can reduced, and the buckling of the wire can reliably be prevented.

Moreover, in the optical semiconductor device of one embodiment, the wire has a parallel portion that extends from the optical semiconductor element and is about parallel to the lead frame.

According to the optical semiconductor device of the embodiment, the wire has the parallel portion that extends from the optical semiconductor element and is about parallel to the lead frame. Therefore, the rise of the wire can roughly be eliminated, and the buckling of the wire can reliably be prevented.

Moreover, in the optical semiconductor device of one embodiment, the device has an integrated circuit chip that is mounted on the lead frame and encapsulated with the first mold resin portion and controls driving of the optical semiconductor element, and the lead frame and the integrated circuit chip are mutually electrically connected via the wire having a low loop configuration.

According to the optical semiconductor device of the embodiment, the lead frame and the integrated circuit chip are mutually electrically connected via the wire having a low loop configuration. Therefore, the thickness of the first mold resin portion can be reduced by an interaction with the wire having a low loop configuration connected to the optical semiconductor element, and the package can be reduced in size and thickness.

Moreover, in the optical semiconductor device of one embodiment, a transparent conductive film that covers at least a region, which is located above the optical semiconductor element, of a surface of the first mold resin portion is formed, and the optical semiconductor element, the first mold resin portion and the transparent conductive film are encapsulated with the second mold resin portion.

According to the optical semiconductor device of the embodiment, an optical semiconductor device, which is able to reduce electronic noises from the outside with a high transmissivity possessed by the transparent conductive film formed to cover the region of the surface of the first mold resin portion at least above the optical semiconductor element and has a satisfactory optical transmission quality free from malfunction, can be fabricated at low cost.

Moreover, in the optical semiconductor device of one embodiment, a conductive resin portion, which covers a region other than a portion that carries out at least one of light reception and light emission of the optical semiconductor element of a surface of the first mold resin portion is formed, and the optical semiconductor element, the first mold resin portion and the conductive resin portion are encapsulated with the second mold resin portion.

According to the optical semiconductor device of the embodiment, an optical semiconductor device, which is able to reduce electronic noises and optical noises from the outside by the conductive resin portion formed to cover the surface of the first mold resin portion in the region other than the portion that carries out at least one of light reception and light emission of the optical semiconductor element and has a satisfactory optical transmission quality free from malfunction, can be fabricated at low cost.

Moreover, in the optical semiconductor device of one embodiment, the device includes a silicone resin portion that covers at least a portion that carries out light reception or light emission of the optical semiconductor element, the first mold resin portion has a hole portion that exposes a part of the silicone resin portion and encapsulates the other part portion of the silicone resin portion and the optical semiconductor element, and the second mold resin portion encapsulates the part of the silicone resin portion and at least part of the first mold resin portion.

According to the optical semiconductor device of the embodiment, by encapsulating the part of the silicone resin portion not with the first mold resin portion but with only the second mold resin portion, the scattering of light in the first mold resin portion can be reduced. That is, an optical path that does not pass through the first mold resin portion can be formed.

Moreover, since the first mold resin portion has the hole portion, the size of part of the silicone resin portion can be defined by the hole portion. Then, by preparatorily setting definite the size and shape of the aperture of the hole portion, the variation in the aperture of each hole portion can be suppressed when a plurality of optical semiconductor devices are fabricated. That is, the variation in the size of the part of the silicone resin portion exposed from the hole portion is suppressed, and a prescribed quantity of light can be obtained at the time of transmission or reception.

Moreover, the optical semiconductor device fabricating method of the present invention includes:

a first step of covering a portion that carries out light reception or light emission of a optical semiconductor element on a lead frame with a silicone resin portion;

a second step of forming a hole portion that exposes a part of the silicone resin portion and concurrently encapsulating the other part of the silicone resin portion and the optical semiconductor device with a first mold resin portion; and a third step of encapsulating the part of the silicone resin portion and at least part of the first mold resin portion with a second mold resin portion.

According to the optical semiconductor device fabricating method of the present invention, while forming the hole portion that exposes the part of the silicone resin portion, the other part of the silicone resin portion and the optical semiconductor element are encapsulated with the first mold resin portion. Therefore, the size of part of the silicone resin portion can be defined by the hole portion. Then, by preparatorily setting definite the size and shape of the aperture of the hole portion, the variation in the aperture of each hole portion can be suppressed when a plurality of optical semiconductor devices are fabricated. That is, the variation in the size of the part of the silicone resin portion exposed from the hole portion is suppressed, and a prescribed quantity of light can be obtained at the time of transmission or reception.

Moreover, since the part of the silicone resin portion is encapsulated not with the first mold resin portion but with only the second mold resin portion, the scattering of light in the first mold resin portion can be reduced. That is, an optical path that does not pass through the first mold resin portion can be formed.

Moreover, in the optical semiconductor device of one embodiment, the lead frame includes:

a header portion on which the optical semiconductor element is mounted; and a gate portion, in which a gate region for injecting a resin from outside into a region where an inner resin portion and an outer resin portion that enclose the header portion are formed, is formed, and the gate portion includes a dual structure having two first gate members that interpose the gate region at a prescribed interval and two second gate members that further interpose the two first gate members on an outer side.

According to the optical semiconductor device of the embodiment, it becomes possible to form the inner resin portion by injecting the primary resin from the gate region interposed between the first gate members of the gate region and thereafter form the outer resin portion by injecting the secondary resin from the gate region interposed between the second gate members of the gate portion by removing the first gate members in forming the inner resin portion that surrounds the header portion. Therefore, a lead frame, which does not convolve the primary resin in the outer resin portion in the neighborhood of the gate portion even in the case of a package that does not permit the resin encapsulating of the through gate type and is optimum for an optical semiconductor device for optical communications, can be provided.

Moreover, the lead frame of the present invention includes:

a header portion on which a semiconductor device is mounted; and a gate portion, in which a gate region for injecting a resin from outside into a region where an inner resin portion and an outer resin portion that surround the header portion are formed, is formed, wherein, the gate portion includes a dual structure having two first gate members that interpose the gate region at a prescribed interval and two second gate members that further interpose the two first gate members on an outer side.

According to the lead frame of the present invention, it becomes possible to form the inner resin portion by injecting the primary resin from the gate region interposed between the first gate members of the gate region and thereafter form the outer resin portion by injecting the secondary resin from the gate region interposed between the second gate members of the gate portion by removing the first gate members in forming the inner resin portion that surrounds the header portion. Therefore, a lead frame, which does not convolve the primary resin in the outer resin portion in the neighborhood of the gate portion even in the case of a package that does not permit the resin encapsulating of the through gate type and is optimum for an optical semiconductor device for optical communications, can be provided.

Moreover, in the lead frame of one embodiment, the lead frame includes:

a first tie bar provided to surround a first mold region where the inner resin portion is formed excluding the gate region formed of the gate portion; and a second tie bar provided to surround a second mold region where the outer resin portion that surrounds an outside of the first tie bar and the inner resin portion is formed.

According to the lead frame of the embodiment, the second mold region where the inner resin portion that surrounds the header portion is formed is surrounded by the first tie bar, so that the resin flash can be prevented from occurring in the lead terminals, the fin portions and so on in forming the inner resin portion, and the primary resin can be prevented from flowing around the second tie bars, the lead terminals, the fin portions and so on in forming the outer resin portion. The entire circumference of the first mold region is not surrounded by only the first tie bar, but the first mold region is surrounded by the first tie bar, the lead terminals and the fin portions, which are continuously ranging. Moreover, the entire circumference of the second mold region is not surrounded by only the second tie bar, but the second mold region is surrounded by the second tie bar, the lead terminals and the fin portions, which are continuously ranging.

Moreover, in the lead frame of one embodiment, the lead frame includes:

a suspension pin that connects at least one of the header portion and an inner lead portion with the first tie bar.

According to the lead frame of the embodiment, at least one of the header portion and the inner lead portion can be held by the suspension pin, so that the portion can be made undeformable at the time of die bonding or wire bonding to the header portion of the semiconductor element.

Moreover, an optical semiconductor device fabricating method of the present invention is:

a fabricating method of an optical semiconductor device of a dual mold type that employs any one of the lead frames described above, and the method includes:

a step of mounting the optical semiconductor element on the header portion of the lead frame;

a primary molding process of forming the inner resin portion that covers the header portion on which the optical semiconductor element is mounted by injecting a resin from the gate region interposed between the first gate members of the lead frame;

a removal step of removing a resin burr of the inner resin portion and the first gate members of the lead frame after the primary molding process; and a secondary molding process of forming the outer resin portion that surrounds the inner resin portion by injecting a resin from the gate region interposed between the second gate members of the lead frame after the removal step.

According to the optical semiconductor device fabricating method of the embodiment, an optical semiconductor device, which is able to prevent the occurrence of the resin flash or the like at the outer terminals and the fin portions and does not convolve the primary resin in the secondary mold portion even in the case of a package that does not permit resin encapsulating of the through gate type or the like and is appropriate for optical communications, can be provided.

Moreover, in the optical semiconductor device fabricating method of one embodiment, the lead frame is provided with a first tie bar so as to surround a primary mold region where the inner resin portion is formed excluding the gate region formed of the gate portion, and the method includes a step of punching the first tie bar of the lead frame after the primary molding process and before the secondary molding process.

According to the optical semiconductor device fabricating method of the embodiment, by punching the first tie bar of the lead frame after the primary molding process and before the secondary molding process, the resin flash occurring in the primary molding process can be removed together with the first tie bar.

Moreover, in the optical semiconductor device fabricating method of one embodiment, a suspension pin that connects the header portion with the first tie bar is punched in the step of punching the first tie bar of the lead frame.

According to the optical semiconductor device fabricating method of the embodiment, the suspension pin is not exposed to the outside from the outer resin portion when the secondary molding process is completed, and therefore, moisture and the like do not enter from the exposed portion, and reliability can be improved.

Moreover, the electronic equipment of the present invention includes:

the optical semiconductor device that employs the lead frame, or, the optical semiconductor device fabricated by the optical semiconductor device fabricating method.

According to the electronic equipment of the present invention, electronic equipment, which has a high performance and a high reliability, can be provided by employing the optical semiconductor device of satisfactory characteristics that employs the lead frame.

Moreover, the electronic equipment of the present invention is characterized by including any one of the optical semiconductor devices.

According to the electronic equipment of the present invention, high-quality inexpensive electronic equipment can be fabricated by employing the optical semiconductor device that has a high reliability and a satisfactory optical transmission quality.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1:
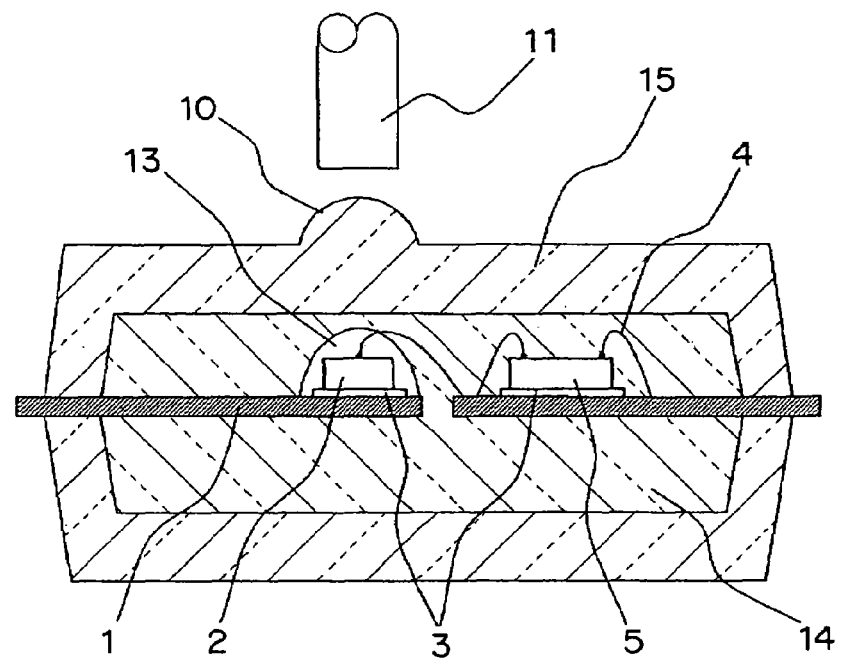
FIG. 1 is an explanatory view schematically showing the construction of an optical semiconductor device according to a first embodiment of the present invention.

Optical semiconductor devices of the present invention will be described in detail below by the embodiments shown in the drawings.

First Embodiment

FIG. 1 is a schematic structural view of the optical semiconductor device of the first embodiment of the present invention.

In the optical semiconductor device of the first embodiment, as shown in FIG. 1, an optical semiconductor element 2 and an integrated circuit chip 5 for controlling the driving of the optical semiconductor element 2 are mounted bonded onto a lead frame 1 with a conductive adhesive paste 3. Then, the optical semiconductor element 2 is coated with a silicone resin that has cold resistance, forming a silicone resin portion 13. The optical semiconductor element 2, the silicone resin portion 13 and the integrated circuit chip 5 are encapsulated with a first mold resin portion 14 made of a translucent mold resin, and the outer peripheral portion of the first mold resin portion 14 is encapsulated with a second mold resin portion 15 made of a translucent mold resin of a high transmissivity other than the first mold resin portion. With this arrangement, the optical semiconductor device forms a two-layer mold structure. The optical semiconductor element 2 and an optical fiber cable 11 are optically coupled with each other by a lens 10 formed in the second mold resin portion 15. Moreover, the optical semiconductor element 2 and the lead frame 1 are electrically connected together via a wire 4.

In the optical semiconductor device of the first embodiment, the coefficient of linear expansion $\alpha 1$ of the first mold resin portion 14 is made smaller than the coefficient of linear expansion $\alpha 2$ of the second mold resin portion 15. With this arrangement, a difference in the coefficient of linear expansion between the first mold resin portion 14, the lead frame 1 and the optical semiconductor element 2 can be reduced, and the troubles of the disconnection of the bonding wire and package cracking and the like due to thermal stresses can be prevented by a simple construction. Therefore, a highly reliable optical semiconductor device of a satisfactory optical transmission quality can be fabricated compactly at low cost.

Moreover, an optical semiconductor device, which is able to reduce the stresses applied to the bonded wire 4 by virtue of the elasticity of the silicone resin portion 13 maintained even at low temperature by covering the optical semiconductor element 2 with the silicone resin portion 13 that has cold resistance and has a higher reliability, can be fabricated.

Moreover, the transmissivity of the first mold resin portion 14 is smaller than the transmissivity of the second mold resin portion 15. Therefore, the diffraction of external disturbance light in the first mold resin portion 14 can be reduced, and the signal-to-noise ratio can be improved. Moreover, the scattering of light in the first mold resin portion 14 can be reduced, and the efficiency of reception or transmission can be improved.

Moreover, the transmissivity of the silicone resin portion 13 is greater than the transmissivity of the first mold resin portion 14 and the transmissivity of the second mold resin portion 15. Therefore, the silicone resin portion 13 has a superior light permeability (translucency or transparency) and a further reduced loss in the quantity of light in comparison with the first mold resin portion 14 and the second mold resin portion 15.

Second Embodiment

Next, the optical semiconductor device of the second embodiment of the present invention has the same construction as that of the optical semiconductor device of the first embodiment except for the first mold resin portion and therefore should correspondingly be referred to FIG. 1.

In the optical semiconductor device of the second the embodiment, a mold resin filled with filler (e.g., special silica) is used for the first mold resin portion 14, and the loading weight of filler of the mold resin to be used is adjusted so that a difference between the coefficient of linear expansion of the lead frame 1 and the coefficient of linear expansion $\alpha 1$ of the first mold resin portion 14 becomes 0 to $6.0 \times 10^{-5}$.

According to the optical semiconductor device of the second embodiment, an optical semiconductor device, which is able to reduce the troubles of the disconnection of the wire 4 and the separation of the optical semiconductor element 2 and the integrated circuit chip 5 caused by the separation between the lead frame 1 and the mold resin portion 14 due to thermal stresses and has a higher reliability, can be fabricated.

The condition that the difference between the coefficient of linear expansion of the lead frame 1 and the coefficient of linear expansion $\alpha 1$ of the first mold resin portion 14 is set to 0 to $6.0 \times 10^{-5}$ in the optical semiconductor device of the second embodiment may be applied to the optical semiconductor devices of third through twenty-sixth embodiments described later.

Third Embodiment

Next, the optical semiconductor device of the third embodiment of the present invention has the same construction as that of the optical semiconductor device of the first embodiment except for a second mold resin portion and therefore should correspondingly be referred to FIG. 1.

In the optical semiconductor device of the third embodiment, a difference between the coefficient of linear expansion $\alpha 1$ of the first mold resin portion 14 and the coefficient of linear expansion $\alpha 2$ of the second mold resin portion 15 is set to 0 to $6.0 \times 10^{-5}$.

According to the optical semiconductor device of the third embodiment, an optical semiconductor device, which is able to reduce the troubles of the moisture resistance and so on due to resin interface separation caused by a thermal contraction difference between the first mold resin portion 14 and the second mold resin portion 15 and has a high reliability, can be fabricated.

The condition that the difference between the coefficient of linear expansion of the first mold resin portion and the coefficient of linear expansion of the second mold resin portion is set to 0 to $6.0 \times 10^{-5}$ in the optical semiconductor device of the third embodiment may be applied to the optical semiconductor devices of the second embodiment and fourth through twenty-sixth embodiments described later.

Fourth Embodiment

Next, the optical semiconductor device of the fourth embodiment of the present invention has the same construction as that of the first embodiment except for the materials of the first and second mold resin portions and should correspondingly be referred to FIG. 1.

In the optical semiconductor device of the fourth embodiment, a phenolic curing epoxy resin that has a high glass-transition temperature Tg and a fast curability is used as a translucent mold resin for the first and second mold resin portions 14 and 15.

According to the optical semiconductor device of the fourth embodiment, an optical semiconductor device, which is able to easily control the coefficient of linear expansion, the thermal conductivity and the transmissivity and has a satisfactory optical transmission quality and a high reliability, can be fabricated compactly at low cost.

An acid anhydride curing epoxy resin of high transparency may be used for the first and second mold resin portions in place of the phenolic curing epoxy resin, and a similar effect can be produced also in this case. Moreover, the optical semiconductor device of the fourth embodiment may be applied to the optical semiconductor devices of the second and third embodiments.

Fifth Embodiment

Figure 2:
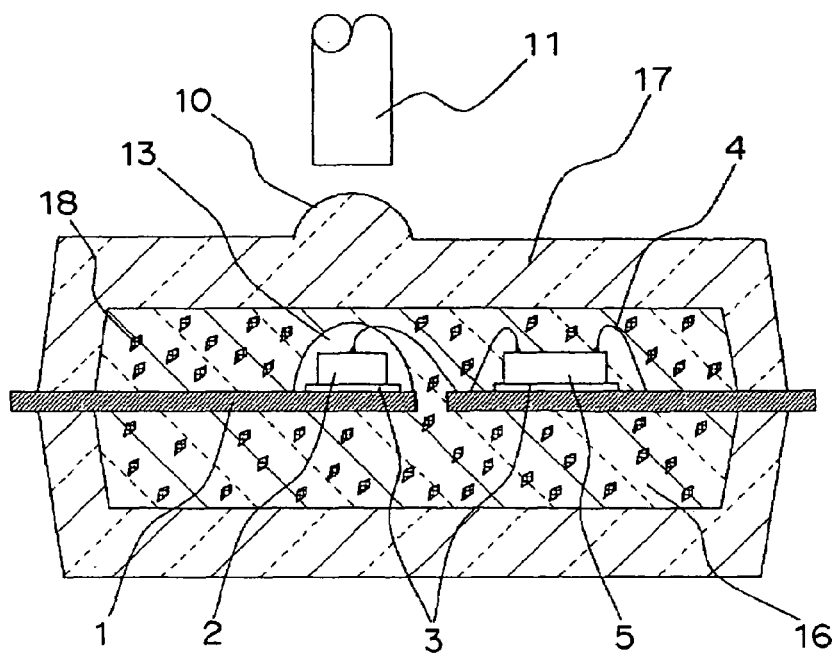
FIG. 2 is an explanatory view schematically showing the construction of an optical semiconductor device according to a fifth embodiment of the present invention.

FIG. 2 is a schematic structural view of the optical semiconductor device of the fifth embodiment of the present invention. The optical semiconductor device of the fifth embodiment of the present invention has the same construction as that of the first embodiment except for the first and second mold resin portions, and like components are denoted by like reference numerals with no description provided therefor.

In the optical semiconductor device of the fifth embodiment, as shown in FIG. 2, a phenolic curing epoxy resin of a small coefficient of linear expansion $\alpha 1$ of a high transmissivity filled with a transparent filler 18 is used for a first mold resin portion 16, and an acid anhydride curing epoxy resin, which has a high transmissivity and is filled with no filler, is used for a second mold resin portion 17.

According to the optical semiconductor device of the fifth embodiment, an optical semiconductor device having a satisfactory optical transmission quality and a high reliability can be fabricated compactly at low cost.

The optical semiconductor device of the fifth embodiment may be applied to the optical semiconductor devices of the second and third embodiments.

Sixth Embodiment

Figure 3:
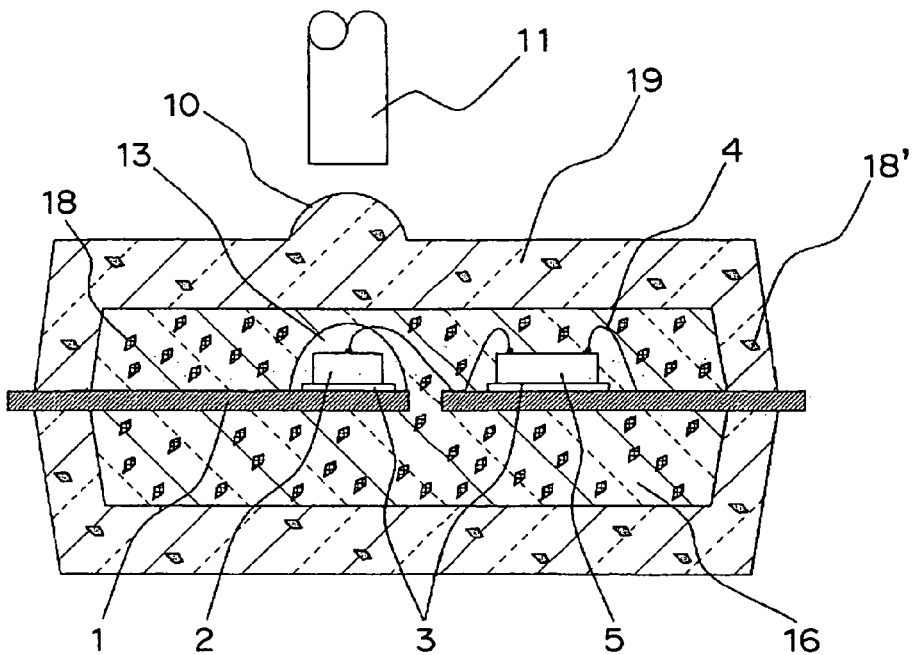
FIG. 3 is an explanatory view schematically showing the construction of an optical semiconductor device according to a sixth embodiment of the present invention.

FIG. 3 is a schematic structural view of the optical semiconductor device of the sixth embodiment of the present invention. The optical semiconductor device of the sixth embodiment of the present invention has the same construction as that of the fifth embodiment except for the second mold resin portion, and like components are denoted by like reference numerals with no description provided therefor.

In the optical semiconductor device of the sixth embodiment, as shown in FIG. 3, a phenolic curing epoxy resin, which has a high transmissivity and a small coefficient of linear expansion $\alpha 1$ and is filled with transparent filler 18, is used for the first mold resin portion 16, and an acid anhydride curing epoxy resin that has a high transmissivity and a small coefficient of linear expansion and is filled with transparent filler 18', is used for a second mold resin portion 19.

According to the optical semiconductor device of the sixth embodiment, an optical semiconductor device, which is able to reduce the troubles of the moisture resistance and so on caused by the resin interface separation due to thermal stresses by reducing the difference in the coefficient of linear expansion between the first mold resin portion 16 and the second mold resin portion 19 and has a higher reliability, can be fabricated.

Seventh Embodiment

Figure 4:
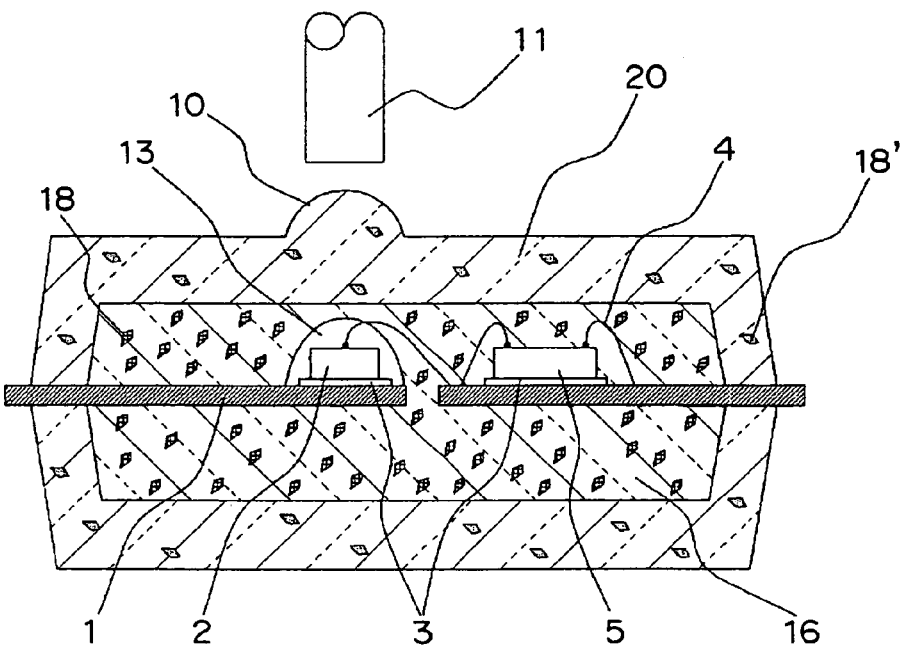
FIG. 4 is an explanatory view schematically showing the construction of an optical semiconductor device according to a seventh embodiment of the present invention.

FIG. 4 is a schematic structural view of the optical semiconductor device of the seventh embodiment of the present invention. The optical semiconductor device of the seventh embodiment of the present invention has the same construction as that of the sixth embodiment except for the second mold resin portion, and like components are denoted by like reference numerals with no description provided therefor.

In the optical semiconductor device of the seventh embodiment, as shown in FIG. 4, a phenolic curing epoxy resin, of which the loading weight of the transparent filler 18' is smaller than that of the first mold resin portion 16, is used for a second mold resin portion 20.

According to the optical semiconductor device of the seventh embodiment, the difference in the coefficient of linear expansion between the first mold resin portion 16 and the second mold resin portion 20 can be further reduced and the occurrence of resin interface separation due to thermal stresses can be reduced by using a phenolic curing epoxy resin, which has a high transmissivity and a small coefficient of linear expansion $\alpha 1$ and is filled with the transparent filler 18, for the first mold resin portion 16. Moreover, the phenolic curing epoxy resin used for the first and second mold resin portions 16 and 20 has curing speed faster than that of the acid anhydride curing epoxy resin. Therefore, an optical semiconductor device, which is able to shorten the encapsulating time and has a high reliability, can be fabricated at low cost.

Eighth Embodiment

Figure 5:
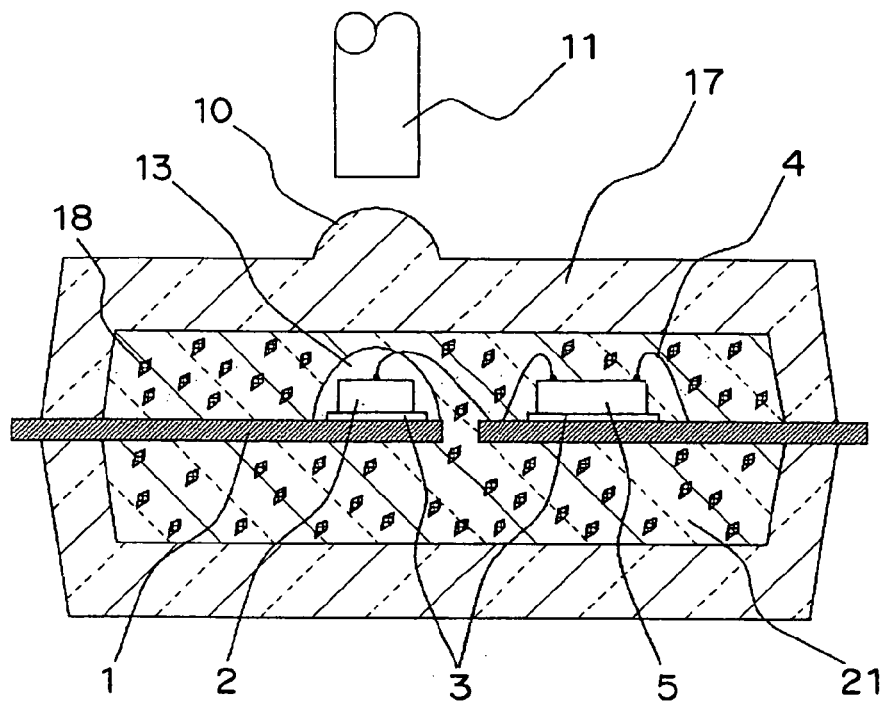
FIG. 5 is an explanatory view schematically showing the construction of an optical semiconductor device according to a eighth embodiment of the present invention.

FIG. 5 is a schematic structural view of the optical semiconductor device of the eighth embodiment of the present invention. The optical semiconductor device of the eighth embodiment of the present invention has the same construction as that of the fifth embodiment except for the first mold resin portion, and like components are denoted by like reference numerals with no description provided therefor.

In the optical semiconductor device of the seventh embodiment, as shown in FIG. 5, an acid anhydride curing epoxy resin, which has a high transmissivity and a small coefficient of linear expansion $\alpha 1$ and is filled with transparent filler 18, is used for a first mold resin portion 21, and an acid anhydride curing epoxy resin, which has a high transmissivity and is filled with no filler, is used for the second mold resin portion 17.

According to the optical semiconductor device of the eighth embodiment, an optical semiconductor device, which has a satisfactory optical transmission quality and a high reliability, can be fabricated compactly at low cost.

The optical semiconductor device of the eighth embodiment may be applied to the optical semiconductor devices of the first and third embodiments.

Ninth Embodiment

Figure 6:
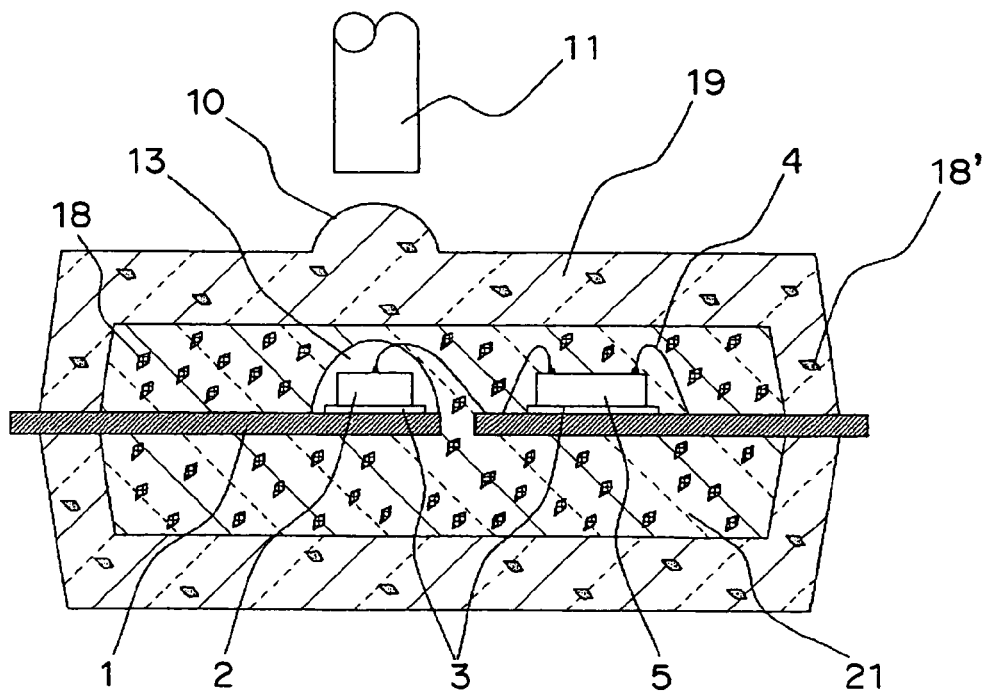
FIG. 6 is an explanatory view schematically showing the construction of an optical semiconductor device according to a ninth embodiment of the present invention.

FIG. 6 is a schematic structural view of the optical semiconductor device of the ninth embodiment of the present invention. The optical semiconductor device of the ninth embodiment of the present invention has the same construction as that of the sixth embodiment except for the first mold resin portion, and like components are denoted by like reference numerals with no description provided therefor.

In the optical semiconductor device of the ninth embodiment, as shown in FIG. 6, an acid anhydride curing epoxy resin filled with transparent filler 18' is used for the second mold resin portion 19. The loading weight of filler with which the second mold resin portion 19 is filled is set to 75% or less than that of the filler with which the first mold resin portion 21 is filled.

According to the optical semiconductor device of the ninth embodiment, an optical semiconductor device, which is able to reduce the difference in the coefficient of linear expansion between the first mold resin portion 21 and the second mold resin portion 19 and reduce the troubles of the moisture resistance and so on caused by the resin interface separation due to thermal stresses and has a higher reliability by using the acid anhydride curing epoxy resin, which has a high transmissivity and a small coefficient of linear expansion α1 and is filled with transparent filler 18 for the first mold resin portion 21, can be fabricated.

Tenth Embodiment

Figure 7:
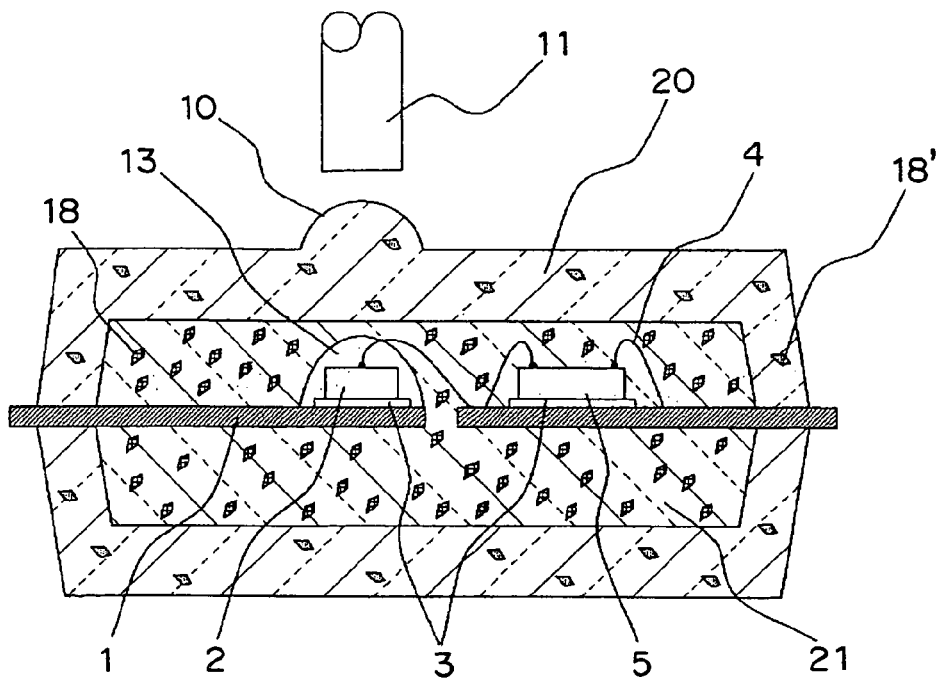
FIG. 7 is an explanatory view schematically showing the construction of an optical semiconductor device according to a tenth embodiment of the present invention.

FIG. 7 is a schematic structural view of the optical semiconductor device of the tenth embodiment of the present invention. The optical semiconductor device of the tenth embodiment of the present invention has the same construction as that of the ninth embodiment except for the second mold resin portion, and like components are denoted by like reference numerals with no description provided therefor.

In the optical semiconductor device of the tenth embodiment, as shown in FIG. 6, a phenolic curing epoxy resin, of which the loading weight of the transparent filler 18' is smaller than that of the first mold resin portion 21, is used for the second mold resin portion 20.

According to the optical semiconductor device of the tenth embodiment, the difference in the coefficient of linear expansion between the first mold resin portion 21 and the second mold resin portion 20 is reduced, and the occurrence of resin interface separation due to thermal stresses can be reduced by using the acid anhydride curing epoxy resin, which has a high transmissivity and a small coefficient of linear expansion α1 and is filled with the transparent filler 18, for the first mold resin portion 21. Moreover, since the curability of the phenolic curing epoxy resin used for the second mold resin portion 20 is faster than that of the acid anhydride curing epoxy resin, an optical semiconductor device, which is able to shorten the encapsulating time and has a high reliability, can be fabricated at low cost.

Eleventh Embodiment

Next, the optical semiconductor device of the eleventh embodiment of the present invention has the same construction as that of the optical semiconductor device of the fifth embodiment except for the first mold resin portion and should correspondingly be referred to FIG. 2.

In the optical semiconductor device of the eleventh embodiment, the loading weight of the transparent filler with which the first mold resin portion 16 is filled is controlled within a range of 20 to 80 percent by weight.

According to the optical semiconductor device of the eleventh embodiment, an optical semiconductor device, which is able to reduce the coefficient of linear expansion α1 of the first mold resin portion 16, increase the thermal conductivity with a high transmissivity maintained and has a satisfactory optical transmission quality and a high reliability, can be fabricated compactly at low cost.

The condition of the loading weight of the transparent filler of the optical semiconductor device of the eleventh embodiment may be applied to the optical semiconductor devices of the sixth through tenth embodiments and twelfth through twenty-sixth embodiments described later.

Twelfth Embodiment

Next, the optical semiconductor device of the twelfth embodiment of the present invention has the same construction as that of the optical semiconductor device of the fifth embodiment except for the first mold resin portion and should correspondingly be referred to FIG. 2.

In the optical semiconductor device of the twelfth embodiment, transparent filler, of which the refractive index is brought close to that of the first mold resin portion 16 to be filled with the filler, is used.

According to the optical semiconductor device of the twelfth embodiment, an optical semiconductor device, which is able to reduce the attenuation of an optical signal due to scattering attributed to the transparent filler in the mold resin and has a more satisfactory optical transmission quality, can be fabricated.

The transparent filler of the optical semiconductor device of the twelfth embodiment may be applied to the optical semiconductor devices of the sixth through eleventh embodiments and thirteenth through twenty-sixth embodiments described later.

Thirteenth Embodiment

Figure 8:
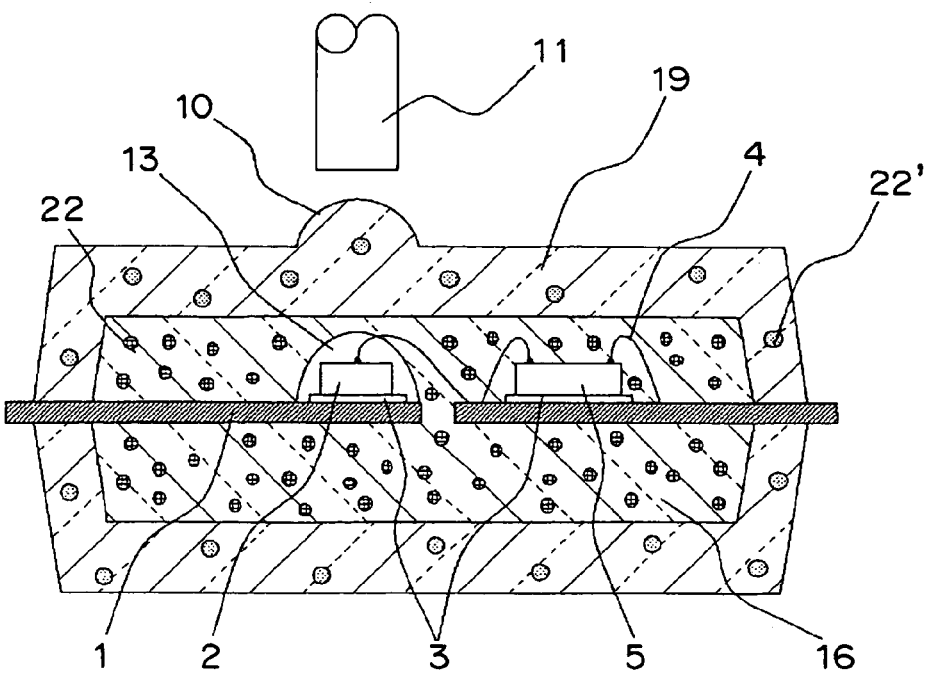
FIG. 8 is an explanatory view schematically showing the construction of an optical semiconductor device according to a thirteenth embodiment of the present invention.

FIG. 8 is a schematic structural view of the optical semiconductor device of the thirteenth embodiment of the present invention. The optical semiconductor device of the thirteenth embodiment of the present invention has the same construction as that of the ninth embodiment except for the first and second mold resin portions, and like components are denoted by like reference numerals with no description provided therefor.

In the optical semiconductor device of the thirteenth embodiment, as shown in FIG. 8, the shapes of transparent fillers 22 and 22' with which the first and second mold resin portions 16 and 19 are respectively filled, are made spherical.

According to the optical semiconductor device of the thirteenth embodiment, the optical signal transmission paths in the first and second mold resin portions 16 and 19 can be stabilized by the spherical transparent fillers 22 and 22', and a stress damage (filler attack) to the semiconductor device due to the fillers can be reduced. Therefore, an optical semiconductor device, which has a satisfactory optical transmission quality and a high reliability, can be fabricated.

Moreover, it is more desirable to uniform the grain size of the spherical fillers.

The optical semiconductor device of the thirteenth embodiment may be applied to the optical semiconductor devices of the sixth through eighth and tenth through twelfth embodiments and fourteenth through twenty-sixth embodiments described later and also applied to the first mold resin portion of the fifth embodiment.

Fourteenth Embodiment

Next, the optical semiconductor device of the fourteenth embodiment of the present invention has the same construction as that of the optical semiconductor device of the first embodiment except for the first and second mold resin portions and should correspondingly be referred to FIG. 1.

The optical semiconductor device of the fourteenth embodiment of the present invention is based on the optical semiconductor device of the first embodiment, in which the first and second mold resin portions 14 and 15 contain a dyestuff that cuts off light having the shorter wavelength (not longer than 400 nm) than the light reception wavelength or emission wavelength of the optical semiconductor element 2. In this case, the "dyestuff" means a light-absorbing agent that absorbs light at a specified wavelength.

According to the optical semiconductor device of the fourteenth embodiment, an optical semiconductor device, which is able to reduce optical noises from the outside by the dyestuff contained in the first and second mold resin portions 14 and 15 and has a satisfactory optical transmission quality and a high reliability free from malfunction, can be fabricated at low cost.

It is acceptable to make at least one of the first and second mold resin portions 14 and 15 contain a dyestuff that cuts off light having the shorter wavelength (not longer than 400 nm). Moreover, the first and second mold resin portions, which contain the dyestuff, of the optical semiconductor device of the fourteenth embodiment may be applied to the optical semiconductor devices of the second through thirteenth embodiments and fifteenth through twenty-sixth embodiments described later.

Fifteenth Embodiment

Figure 9:
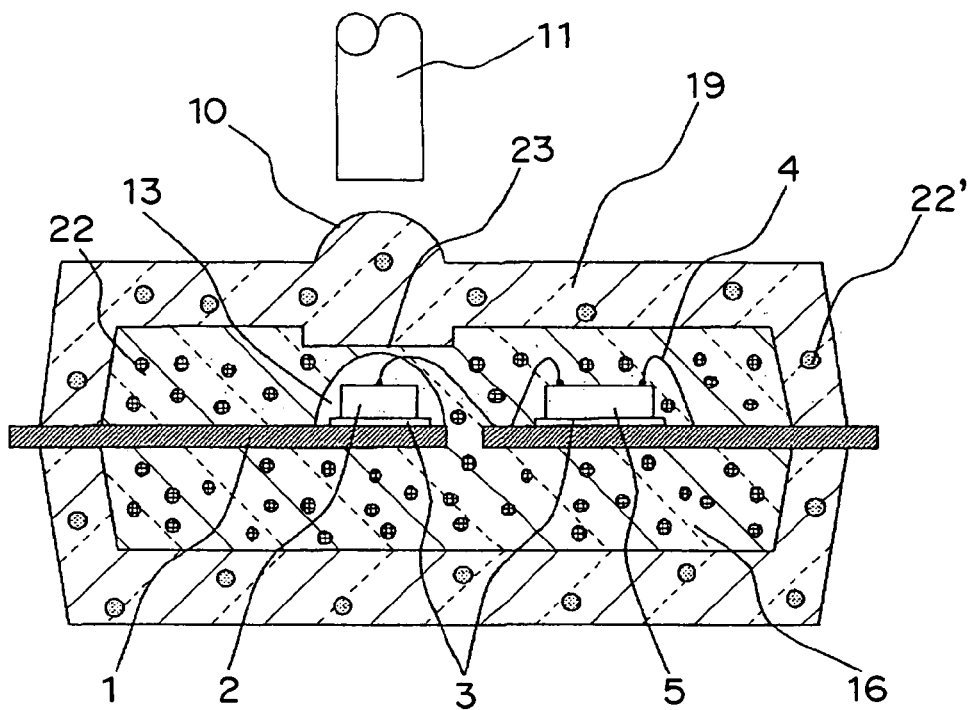
FIG. 9 is an explanatory view schematically showing the construction of an optical semiconductor device according to a fifteenth embodiment of the present invention.

FIG. 9 is a schematic structural view of the optical semiconductor device of the fifteenth embodiment of the present invention. The optical semiconductor device of the fifteenth embodiment has the same construction as that of the optical semiconductor device shown in FIG. 8 of the thirteenth embodiment except for a recess 23, and like components are denoted by like reference numerals with no description provided therefor.

In the optical semiconductor device of the fifteenth embodiment of the present invention, as shown in FIG. 9, the recess 23 is provided at the first mold resin portion 16 above the light-receiving portion of the optical semiconductor element 2. With this arrangement, the thickness of the first mold resin portion 16 above the light-receiving portion of the optical semiconductor element 2 is made as thin as possible with respect to the other portion (the thickness of the first mold resin portion 16 is not greater than 200 μm).

Normally, the height of the wire 4 bonded onto the optical semiconductor element is about 100 to 200 μm. Therefore, if the formation thickness of the metal mold for the first mold resin portion 16 is made entirely not greater than 200 μm, it is concerned that the wire 4 is disadvantageously brought in contact with the metal mold and deformed and disconnected. However, characteristics of a higher optical transmission quality can be obtained when the thickness of the first mold resin portion 16 is made as thin as possible. Therefore, an optical semiconductor device, which is able to reduce the scattering of light due to the filler in the first mold resin portion 16 by making the thickness of only the portion above the light-receiving portion where the wire 4 does not exist as thin as possible (not greater than 200 μm) and has a satisfactory optical transmission quality and a high reliability, can be fabricated at low cost.

The construction, in which the thickness of the first mold resin portion of the optical semiconductor device of the fifteenth embodiment is reduced by providing the recess, may be applied to the fifth through twelfth and fourteenth embodiments in which the first mold resin portion is filled with the filler and sixteenth through twenty-sixth embodiments described later.

Sixteenth Embodiment

Figure 10:
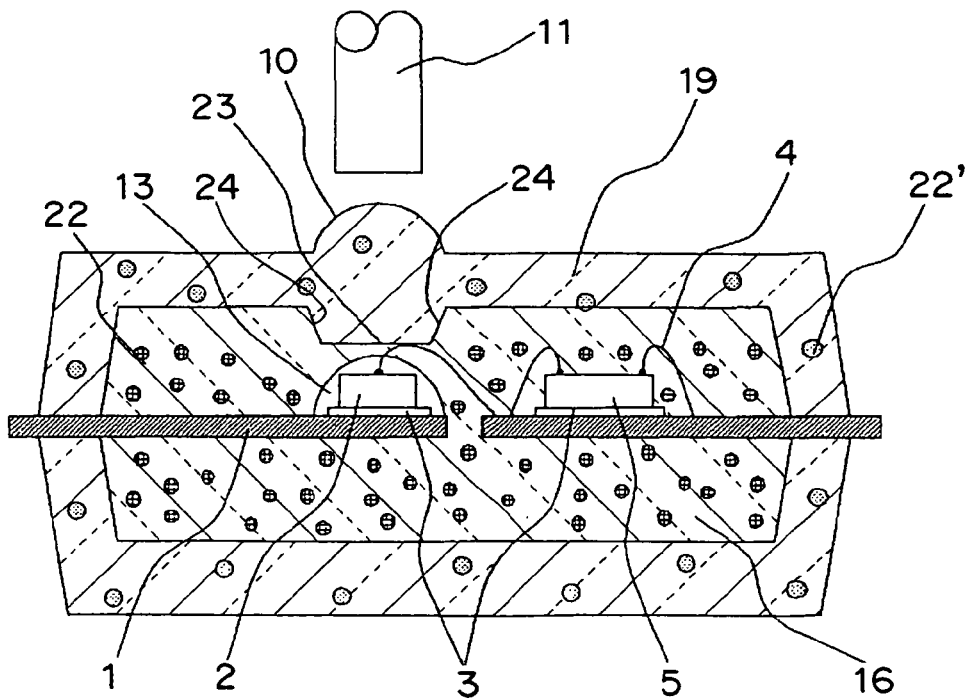
FIG. 10 is an explanatory view schematically showing the construction of an optical semiconductor device according to a sixteenth embodiment of the present invention.

FIG. 10 is a schematic structural view of the optical semiconductor device of the sixteenth embodiment of the present invention. The optical semiconductor device of the sixteenth embodiment has the same construction as that of the optical semiconductor device shown in FIG. 9 of the fifteenth embodiment except for the sidewall of the recess 23, and like components are denoted by like reference numerals with no description provided therefor.

In the optical semiconductor device of the fifteenth embodiment of the present invention, a taper 24 is provided on the sidewall of the recess 23 provided at the first mold resin portion 16 above the light-receiving or light-emission portion of the optical semiconductor element 2.

According to the optical semiconductor device of the sixteenth embodiment, an optical semiconductor device, which is able to efficiently collect transmission light or reception light by the taper 24 provided on the sidewall of the recess 23 of the first mold resin portion 16 and has a more satisfactory optical transmission quality, can be fabricated at low cost.

Seventeenth Embodiment

Figure 11:
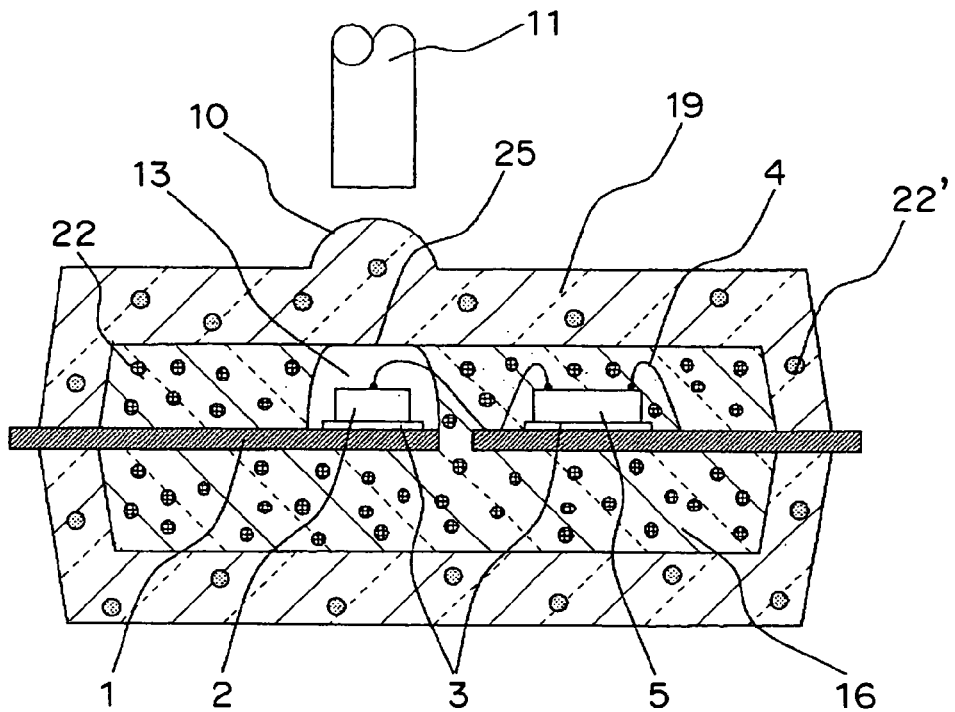
FIG. 11 is an explanatory view schematically showing the construction of an optical semiconductor device according to a seventeenth embodiment of the present invention.

FIG. 11 is a schematic structural view of the optical semiconductor device of the seventeenth embodiment of the present invention. The optical semiconductor device of the seventeenth embodiment has the same construction as that of the optical semiconductor device shown in FIG. 8 of the thirteenth embodiment except for the silicone resin portion 13, and like components are denoted by like reference numerals with no description provided therefor.

In the optical semiconductor device of the seventeenth embodiment of the present invention, the silicone resin portion 13 with which the optical semiconductor element 2 is coated is not encapsulated with the first mold resin portion 16 but encapsulated with the second mold resin portion 19. That is, the silicone resin portion 13 and the second mold resin portion 19 closely adhere to each other by an adhesion portion 25.

According to the optical semiconductor device of the seventeenth embodiment, an optical semiconductor device, which has no optical signal scattering occur in the first mold resin portion 16 since no optical signal passes through the inside of the first mold resin portion 16 and has a satisfactory optical transmission quality, can be fabricated at low cost. Moreover, it becomes possible to increase the loading weight of the transparent filler 22 in the first mold resin portion 16.

The optical semiconductor device of the seventeenth embodiment may be applied to the optical semiconductor devices of the first through sixteenth embodiments and the eighteenth through twenty-sixth embodiments described later.

Eighteenth Embodiment

Figure 12:
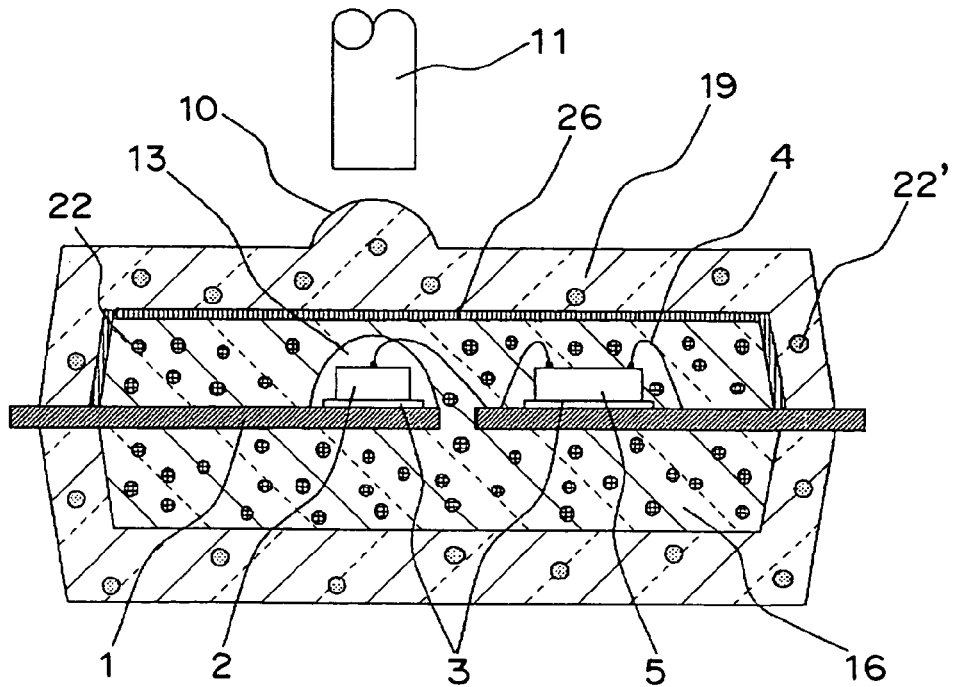
FIG. 12 is an explanatory view schematically showing the construction of an optical semiconductor device according to a eighteenth embodiment of the present invention.

FIG. 12 is a schematic structural view of the optical semiconductor device of the eighteenth embodiment of the present invention. The optical semiconductor device of the eighteenth embodiment has the same construction as that of the optical semiconductor device shown in FIG. 8 of the thirteenth embodiment except for a transparent conductive film 26, and like components are denoted by like reference numerals with no description provided therefor.

In the optical semiconductor device of the eighteenth embodiment of the present invention, a transparent conductive film 26 ($TiO_2$, $In_2O_3$ or the like) is formed between the first mold resin portion 16 and the second mold resin portion 19.

According to the optical semiconductor device of the eighteenth embodiment, an optical semiconductor device, which is able to reduce electronic noises from the outside by the transparent conductive film 26 with a high transmissivity possessed and has a satisfactory optical transmission quality free from malfunction, can be fabricated at low cost.

The transparent conductive film of the optical semiconductor device of the eighteenth embodiment may be applied to the optical semiconductor devices of the first through seventeenth embodiments and nineteenth through twenty-sixth embodiments described later.

Nineteenth Embodiment

Figure 13:
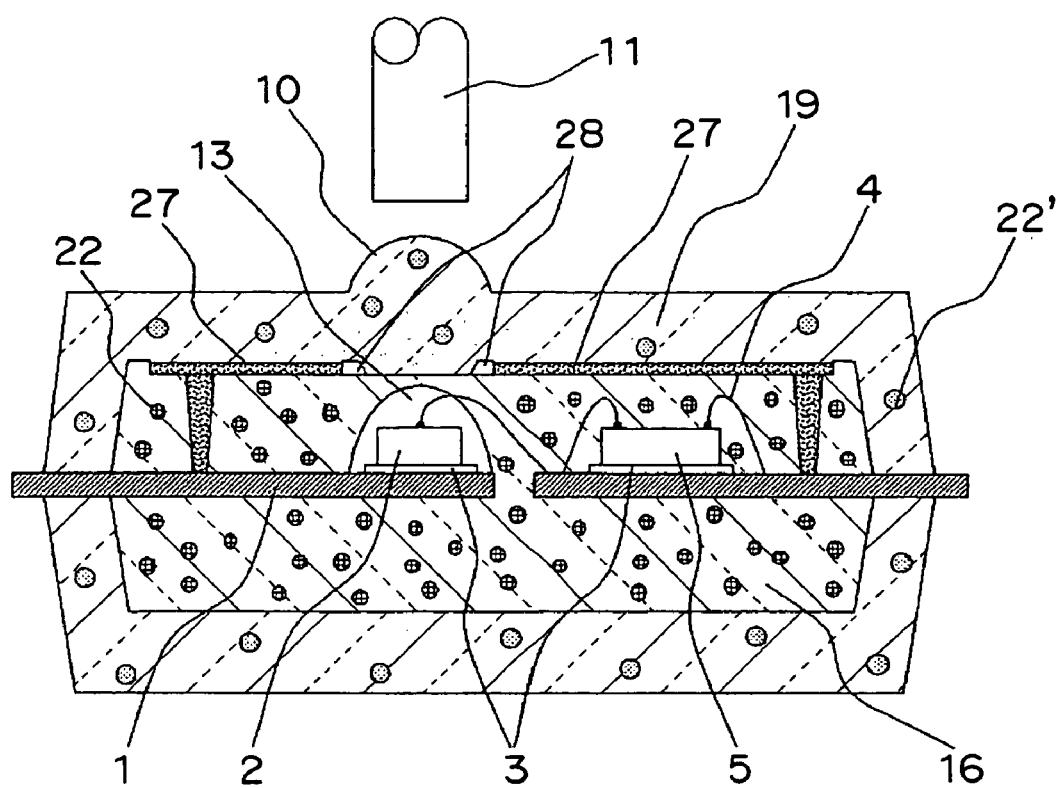
FIG. 13 is an explanatory view schematically showing the construction of an optical semiconductor device according to a nineteenth embodiment of the present invention.

FIG. 13 is a schematic structural view of the optical semiconductor device of the nineteenth embodiment of the present invention. The optical semiconductor device of the nineteenth embodiment has the same construction as that of the optical semiconductor device shown in FIG. 8 of the thirteenth embodiment except for a light-shielding conductive resin portion 27, and like components are denoted by like reference numerals with no description provided therefor.

In the optical semiconductor device of the nineteenth embodiment of the present invention, a groove 31 for applying the light-shielding conductive resin and a hole 32 for contact with the lead frame 1 are formed when the first mold resin portion 16 is molded, and an upper surface portion of the first mold resin portion 16 excluding the light-receiving or light-emission portion of the optical semiconductor element 2 is coated with the light-shielding conductive resin portion 27 and thereafter encapsulated with the second mold resin portion 19. It is noted that a wall 28 for stopping the resin is provided on the first mold resin portion 16 so that the upper surface portion of the light-receiving or light-emission portion of the optical semiconductor element 2 is not covered with the light-shielding conductive resin portion 27.

According to the optical semiconductor device of the nineteenth embodiment, an optical semiconductor device, which is able to reduce electronic noises and optical noises from the outside by the light-shielding conductive resin portion 27 and has a satisfactory optical transmission quality free from malfunction, can be fabricated at low cost.

The light-shielding conductive resin portion of the optical semiconductor device of the nineteenth embodiment may be applied to the optical semiconductor devices of the first through twelfth embodiments, the fourteenth through eighteenth embodiments and the optical semiconductor devices of the twentieth through twenty-sixth embodiments described later.

Twentieth Embodiment

Figure 14:
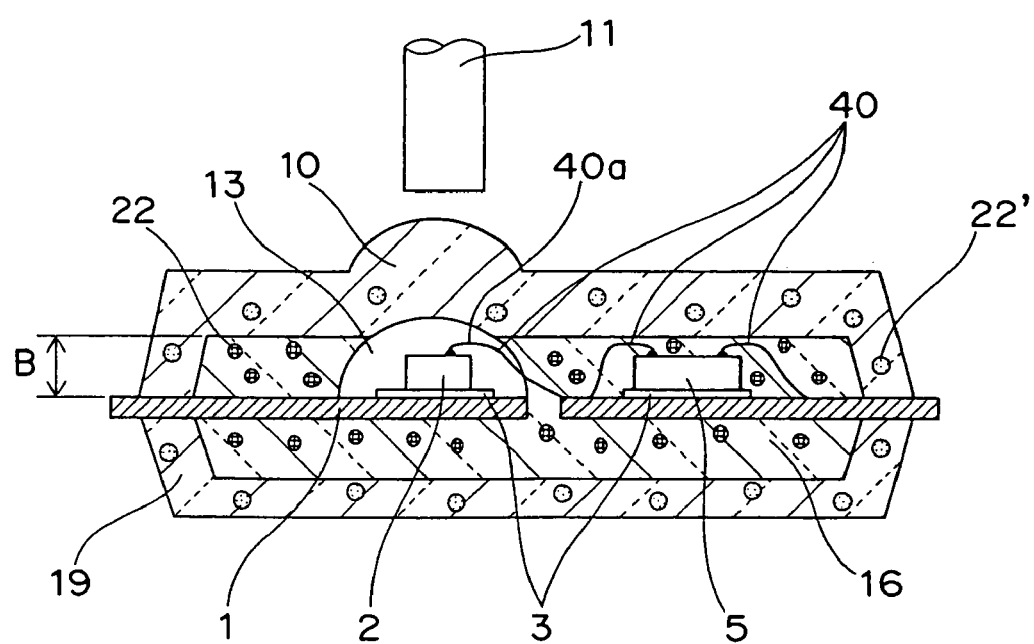
FIG. 14 is an explanatory view schematically showing the construction of an optical semiconductor device according to a twentieth embodiment of the present invention.

FIG. 14 is a schematic structural view of the optical semiconductor device of the twentieth embodiment of the present invention. The optical semiconductor device of the twentieth embodiment has the same construction as that of the optical semiconductor device shown in FIG. 11 of the seventeenth embodiment except for the silicone resin portion 13 and the wire 40, and like components are denoted by like reference numerals with no description provided therefor.

In the optical semiconductor device of the twentieth embodiment of the present invention, the lead frame 1 and the optical semiconductor element 2 are mutually electrically connected via the wire 40 having a low loop configuration. The wire 40 has a parallel portion 40a about parallel to the surface of the lead frame 1 on the optical semiconductor element 2 side. That is, the wire 40 has the parallel portion 40a in the silicone resin portion 13. The wire 40 is formed by subjecting, for example, the optical semiconductor element 2 to primary bonding and subjecting the lead frame 1 to secondary bonding.

According to the optical semiconductor device of the twentieth embodiment, the rise of the wire 40 in the vertical direction with respect to the lead frame 1 can be reduced in the silicone resin portion 13. Therefore, when fabricating this optical semiconductor device, the silicone resin portion 13 is held by a metal mold for the formation of the first mold resin portion 16, and the wire 40 can be prevented from being damaged by preventing the buckling of the wire 40 even if a stress is applied to the silicone resin portion 13.

Moreover, the lead frame 1 and the integrated circuit chip 5 are mutually electrically connected via another wire 40. Therefore, the thickness B of the first mold resin portion 16 can be made thin by an interaction with the wire 40 that connects the optical semiconductor element 2, and the package can be reduced in size and thickness. It is noted that the wire for connecting the integrated circuit chip 5 may not be the wire 40 having a low loop configuration.

The optical semiconductor device of the twentieth embodiment may be applied to the optical semiconductor devices of the first through sixteenth embodiments and the eighteenth and nineteenth embodiments and the optical semiconductor devices of the twenty-sixth embodiment described later.

Twenty-First Embodiment

Figure 15:
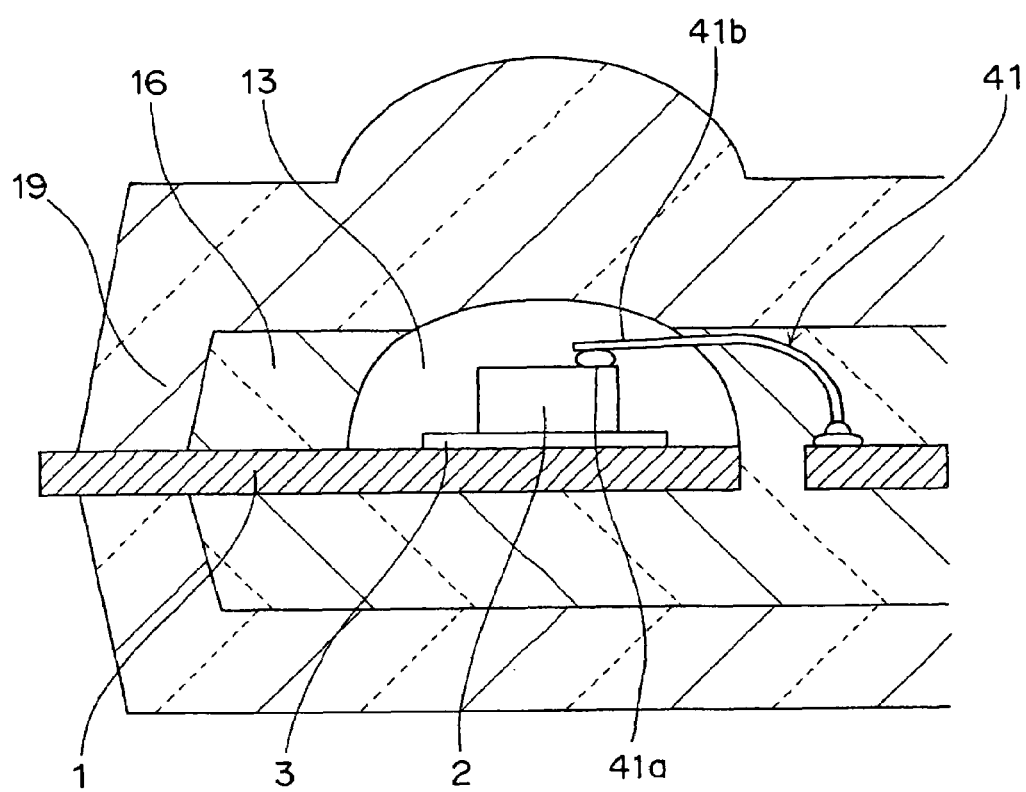
FIG. 15 is an explanatory view schematically showing the construction of an optical semiconductor device according to a twenty-first embodiment of the present invention.

FIG. 15 is a schematic structural view of the optical semiconductor device of the twenty-first embodiment of the present invention. The optical semiconductor device of the twenty-first embodiment has the same construction as that of the optical semiconductor device shown in FIG. 14 of the twentieth embodiment except for a wire 41, and like components are denoted by like reference numerals with no description provided therefor.

In the optical semiconductor device of the twenty-first embodiment of the present invention, the wire 41 having a low loop configuration extends from a bump portion 41a located on the optical semiconductor element 2 and has a parallel portion 41b about parallel to the lead frame 1.

A method for forming the wire 41 is described. First of all, the ball-shaped bump portion 41a is bonded to the electrode of the optical semiconductor element 2. Subsequently, the lead frame 1 is subjected to primary bonding, and the bump portion 41a is subjected to secondary bonding, forming the wire 41.

According to the optical semiconductor device of the twenty-first embodiment, since the wire 41 has the bump portion 41a and the parallel portion 41b, the wire 41 can reliably be connected to the optical semiconductor element 2, so that the wire 41 of a small rise can easily be formed. Moreover, the parallel portion 41b of the wire 41 can easily be formed in a low position (position near the optical semiconductor element 2).

Moreover, when the wire 41 is used for a normal optical semiconductor device and subjected to a thermal cycle test on a temperature condition of −40° C. to +85° C., the device tolerates 500 cycles or less. In contrast to this, when the wire 41 is used for the optical semiconductor device of the present invention and subjected to a thermal cycle test on a severer temperature condition of −40° C. to +105° C., the device can secure a reliability of not smaller than 500 cycles.

The optical semiconductor device of the twenty-first embodiment may be applied to the optical semiconductor devices of the first through sixteenth embodiments and the eighteenth and nineteenth embodiments and the optical semiconductor device of the twenty-sixth embodiment described later.

Twenty-Second Embodiment

Figure 16:
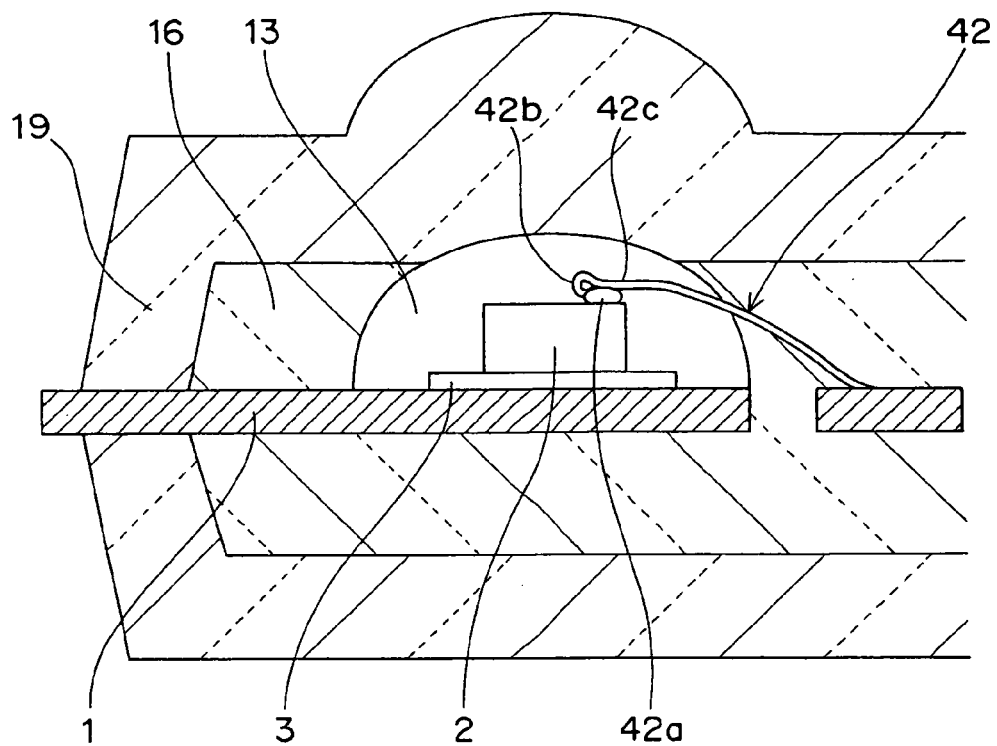
FIG. 16 is an explanatory view schematically showing the construction of an optical semiconductor device according to a twenty-second embodiment of the present invention.

FIG. 16 is a schematic structural view of the optical semiconductor device of the twenty-second embodiment of the present invention. The optical semiconductor device of the twenty-second embodiment has the same construction as that of the optical semiconductor device shown in FIG. 14 of the twentieth embodiment except for a wire 42, and like components are denoted by like reference numerals with no description provided therefor.

In the optical semiconductor device of the twenty-second embodiment of the present invention, the wire 42 having a low loop configuration has a ball portion 42a located on the optical semiconductor element 2, a bent portion 42b that extends from the ball portion 42a and a parallel portion 42c that extends from the bent portion 42b and is about parallel to the lead frame 1.

A method for forming the wire 42 is described. First of all, the electrode of the optical semiconductor element 2 is subjected to primary bonding, forming the ball portion 42a. Subsequently, the bent portion 42b is formed without cutting the wire, the wire is partially placed and collapsed on the top of the ball portion 42a, and the lead frame 1 is subjected to secondary bonding, forming the wire 42.

According to the optical semiconductor device of the twenty-second embodiment, since the wire 42 has the ball portion 42a, the bent portion 42b and the parallel portion 42c, the wire 42 can reliably be connected to the optical semiconductor element 2, and the wire 42 of a small rise can easily be formed.

The optical semiconductor device of the twenty-second embodiment may be applied to the optical semiconductor devices of the first through sixteenth embodiments and the eighteenth and nineteenth embodiments and the optical semiconductor device of the twenty-sixth embodiment described later.

Twenty-Third Embodiment

Figure 17:
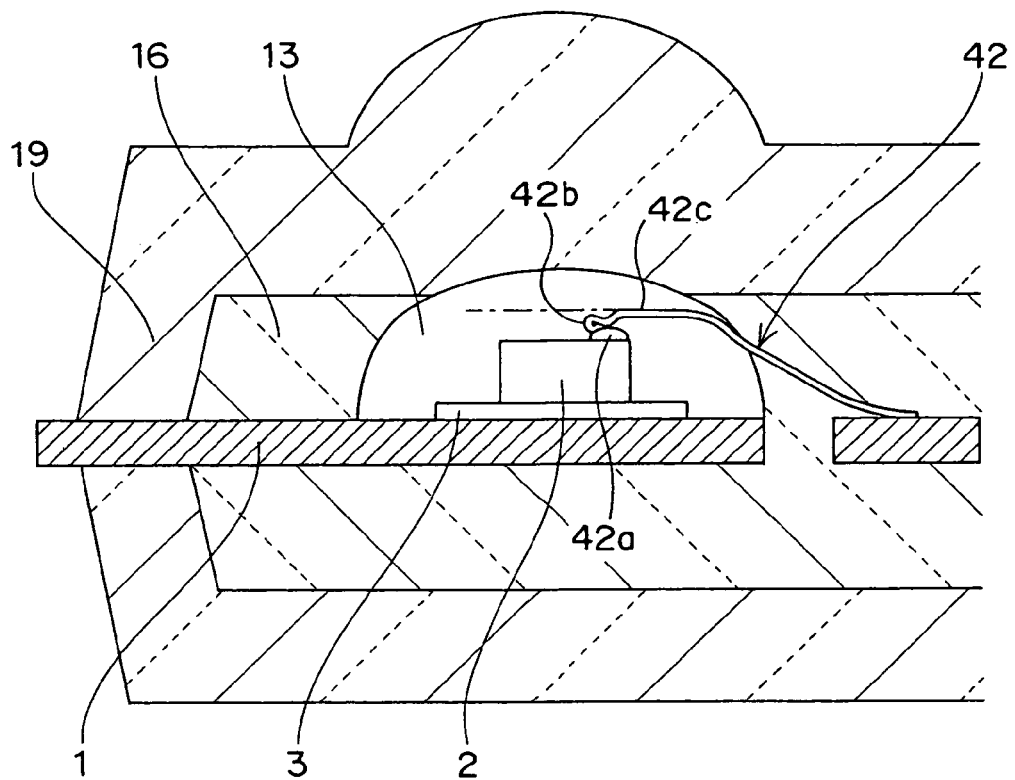
FIG. 17 is an explanatory view schematically showing the construction of an optical semiconductor device according to a twenty-third embodiment of the present invention.

FIG. 17 is a schematic structural view of the optical semiconductor device of the twenty-third embodiment of the present invention. Referring to a point different from the optical semiconductor device shown in FIG. 16 of the twenty-second embodiment, the height of the bent portion 42b from the optical semiconductor element 2 is lower than the height of the parallel portion 42c from the optical semiconductor element 2 in the optical semiconductor device of the twenty-third embodiment.

According to the optical semiconductor device of the twenty-third embodiment, since the height of the bent portion 42b is lower than the height of the parallel portion 42c, the rise of the bent portion 42b can be reduced, and the buckling of the wire 42 can reliably be prevented.

The optical semiconductor device of the twenty-third embodiment may be applied to the optical semiconductor devices of the first through sixteenth embodiments and the eighteenth and nineteenth embodiments and the optical semiconductor device of the twenty-sixth embodiment described later.

Twenty-Fourth Embodiment

Figure 18:
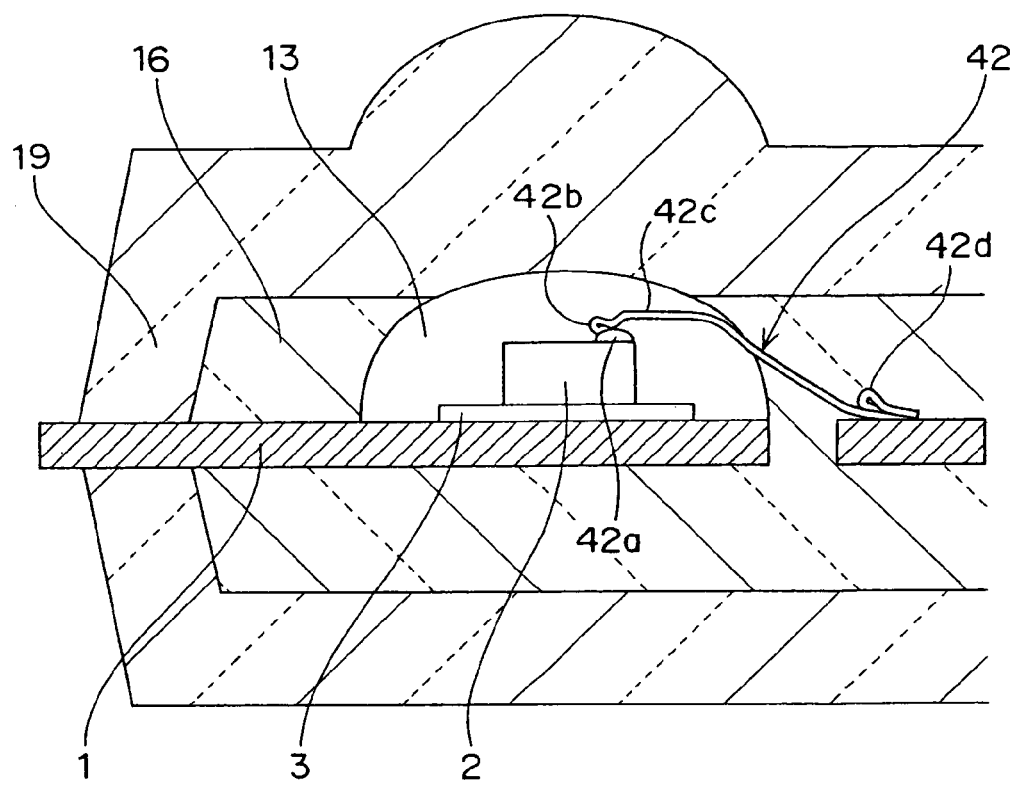
FIG. 18 is an explanatory view schematically showing the construction of an optical semiconductor device according to a twenty-fourth embodiment of the present invention.

FIG. 18 is a schematic structural view of the optical semiconductor device of the twenty-fourth embodiment of the present invention. Referring to a point different from the optical semiconductor device shown in FIG. 17 of the twenty-third embodiment, the wire 42 has a bent portion 42d provided for the lead frame 1 in the optical semiconductor device of the twenty-fourth embodiment.

A method for forming the bent portion 42d is described. After the lead frame is subjected to secondary bonding, a loop is formed without cutting the wire, and the wire is partially collapsed in the secondary bonding position, forming the bent portion 42d.

According to the optical semiconductor device of the twenty-fourth embodiment, since the wire 42 has the bent portion 42d, the bonding strength of the wire 42 to the lead frame 1 can be improved.

The optical semiconductor device of the twenty-fourth embodiment may be applied to the optical semiconductor devices of the first through sixteenth embodiments and the eighteenth and nineteenth embodiments and the optical semiconductor device of the twenty-sixth embodiment described later.

Twenty-Fifth Embodiment

Figure 19:
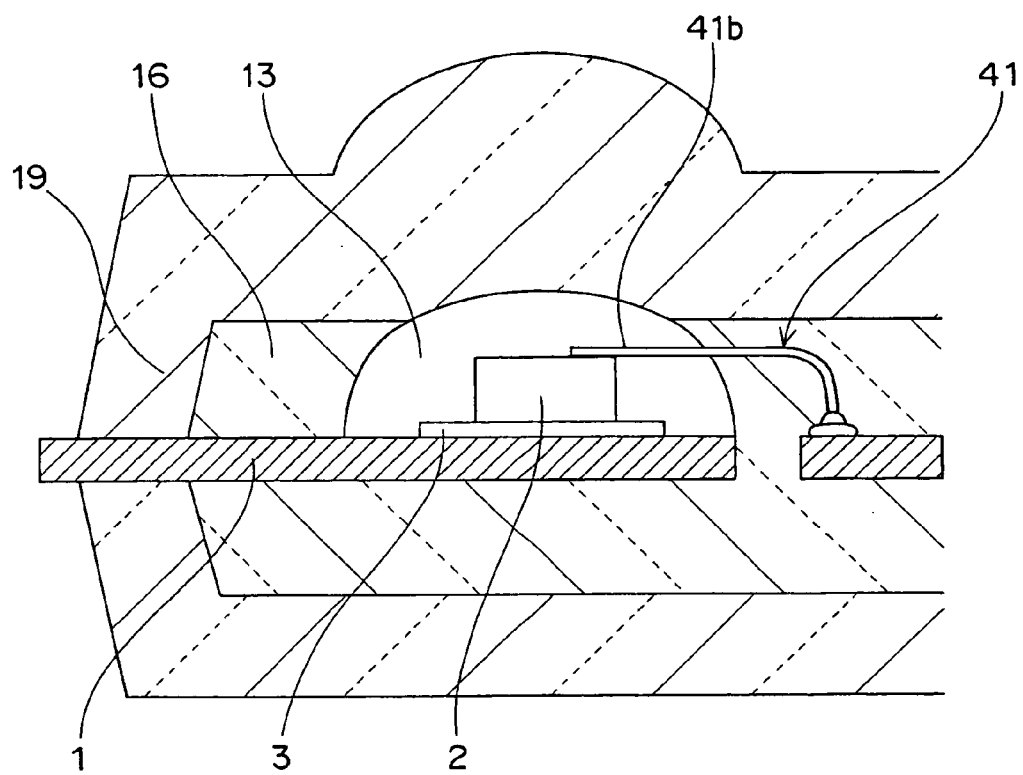
FIG. 19 is an explanatory view schematically showing the construction of an optical semiconductor device according to a twenty-fifth embodiment of the present invention.

FIG. 19 is a schematic structural view of the optical semiconductor device of the twenty-fifth embodiment of the present invention. Referring to a point different from the optical semiconductor device shown in FIG. 15 of the twenty-first embodiment, the wire 41 has a parallel portion 41b that extends from the optical semiconductor element 2 and is about parallel to the lead frame 1 in the optical semiconductor device of the twenty-fifth embodiment. That is, the wire 41 does not have the bump portion 41a.

Referring to a method for forming the wire 41, the lead frame 1 is subjected to primary bonding and the optical semiconductor element 2 is subjected to secondary bonding, forming the wire 41.

According to the optical semiconductor device of the twenty-fifth embodiment, since the wire 41 has the parallel portion 41b that extends from the optical semiconductor element 2 about parallel to the lead frame 1, the rise of the wire 41 can roughly be eliminated, and the buckling of the wire 41 can reliably be prevented.

The optical semiconductor device of the twenty-fifth embodiment may be applied to the optical semiconductor devices of the first through sixteenth embodiments and the eighteenth and nineteenth embodiments and the optical semiconductor device of the twenty-sixth embodiment described later.

Twenty-Sixth Embodiment

Figure 20:
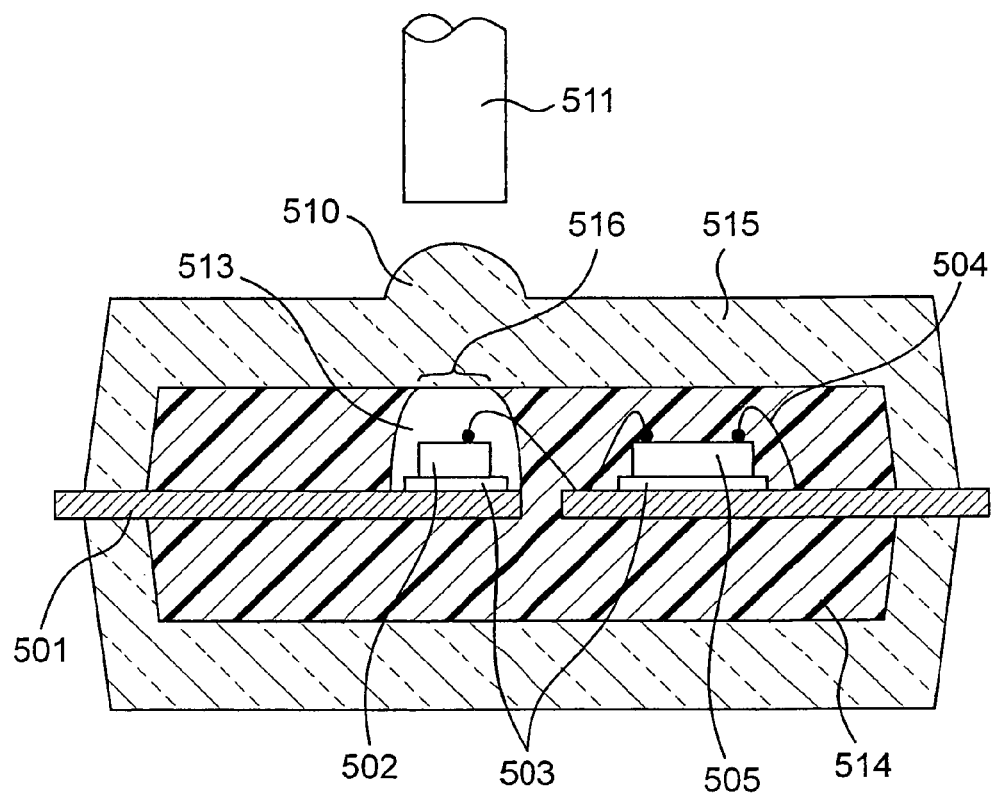
FIG. 20 is a schematic sectional view showing one embodiment of an optical semiconductor device according to a twenty-sixth embodiment of the present invention.

FIG. 20 shows a schematic sectional view of the optical semiconductor device of the twenty-sixth embodiment of the present invention. In the optical semiconductor device, as shown in FIG. 20, an optical semiconductor element 502 and an integrated circuit chip 505 for controlling the driving of the optical semiconductor element 502 are mounted bonded onto the lead frame 501 with a conductive adhesive paste 503. Moreover, the optical semiconductor element 502 and the integrated circuit chip 505 are electrically connected to the lead frame 501 via a wire 504.

Then, the optical semiconductor element 502 is coated with a silicone resin that has cold resistance, forming a silicone resin portion 513. It is noted that the silicone resin portion 513 is only required to cover at least a portion that carries out reception and transmission of light of the optical semiconductor element 502.

The other portion of the silicone resin portion 513 excluding the part of the silicone resin portion 513, the optical semiconductor element 502 and the integrated circuit chip 505 are encapsulated with a first mold resin portion 514 of a first layer. That is, the first mold resin portion 514 has a hole portion 516 that exposes the part of the silicone resin portion 513.

The first mold resin portion 514 is made of, for example, an epoxy resin that has low transparency and a small coefficient of linear expansion. In concrete, the first mold resin portion 514 is made of a phenolic epoxy resin containing filler.

The Part of the silicone resin portion 513 and the outer peripheral portion of the first mold resin portion 514 are encapsulated with a second mold resin portion 515 of a second layer. The second mold resin portion 515 has a coefficient of linear expansion greater than the coefficient of linear expansion of the first mold resin portion 514 and has light permeability (translucency or transparency). The second mold resin portion 515 is made of, for example, an acid anhydride epoxy resin containing filler of high transparency. That is, the optical semiconductor device forms a two-layer mold structure.

A lens 510 is formed on the second mold resin portion 515. An optical fiber cable 511 is placed facing the lens 510. Then, the first mold resin portion 514 does not exist on the optical axis that connects the optical semiconductor element 502 with the optical fiber cable 511, whereas the silicone resin portion 513 and the second mold resin portion 515 (lens 510) exist.

According to the optical semiconductor device of the construction, by making the coefficient of linear expansion of the first mold resin portion 514 smaller than the coefficient of linear expansion of the second mold resin portion 515, the differences in the coefficient of linear expansion between the first mold resin portion 514 and the lead frame 501 and the optical semiconductor element 502 can be reduced. With this arrangement, the disconnection of the bonding wire, the package cracking and so on due to thermal stresses do not occur.

Moreover, by covering the optical semiconductor element 502 with the silicone resin portion 513 that has cold resistance, the elasticity of the silicone resin portion 513 is maintained even at low temperature, by which the stresses applied to the bonded wire 504 can be reduced.

Moreover, by encapsulating part of the silicone resin portion 513 not with the first mold resin portion 514 but with only the second mold resin portion 515, the scattering of light in the first mold resin portion 514 can be reduced. That is, an optical path, which does not extend through the first mold resin portion 514, can be formed.

Moreover, since the first mold resin portion 514 has the hole portion 516, the size of the part of the silicone resin portion 513 can be defined by the hole portion 516. Then, by preparatorily setting definite size and shape of the aperture of the hole portion 516, the variation in the aperture of each hole portion 516 can be suppressed when a plurality of optical semiconductor devices are fabricated. That is, a prescribed quantity of light can be obtained at the time of transmission or reception by suppressing the variation in the size of the part of the silicone resin portion 513 exposed from the hole portion 516.

Therefore, an optical semiconductor device, which has a high reliability and a satisfactory optical transmission quality, can be fabricated compactly at low cost.

It is noted that the first mold resin portion 514 may have a light-shielding property. Since the optical semiconductor element 502 is encapsulated with the first mold resin portion 514, the diffraction of external disturbance light to the optical semiconductor element 502 can be reduced, and the signal-to-noise ratio can be improved.

A method for fabricating the optical semiconductor device is described next.

First of all, the portions for carrying out light reception or emission of the optical semiconductor element 502 on the lead frame 501 are covered with the silicone resin portion 513.

Subsequently, while forming (securing) the hole portion 516 that exposes the part of the silicone resin portion 513, the other portion of the silicone resin portion 513 excluding the part of the silicone resin portion 513 and the optical semiconductor element 502 are encapsulated with the first mold resin portion 514.

Then, the part of the silicone resin portion 513 and at least the part of the first mold resin portion 514 are encapsulated with the second mold resin portion 515.

Accordingly, the other portion of the silicone resin portion 513 and the optical semiconductor element 502 are encapsulated with the first mold resin portion 514 while forming the hole portion 516 that exposes the part of the silicone resin portion 513, and therefore, the size of part of the silicone resin portion 513 can be defined by the hole portion 516.

By preparatorily setting definite size and shape of the aperture of the hole portion 516, the variation in the size of part of the silicone resin portion 513 in each of the optical semiconductor devices can be suppressed.

Figure 21A:
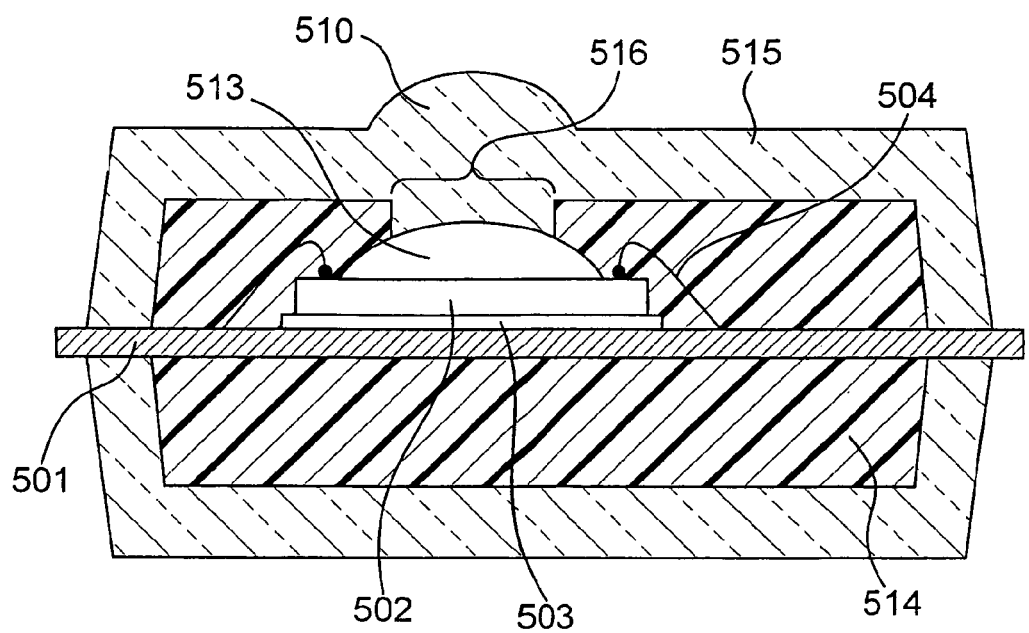
FIG. 21A is a sectional view of another optical semiconductor device.
Figure 22A:
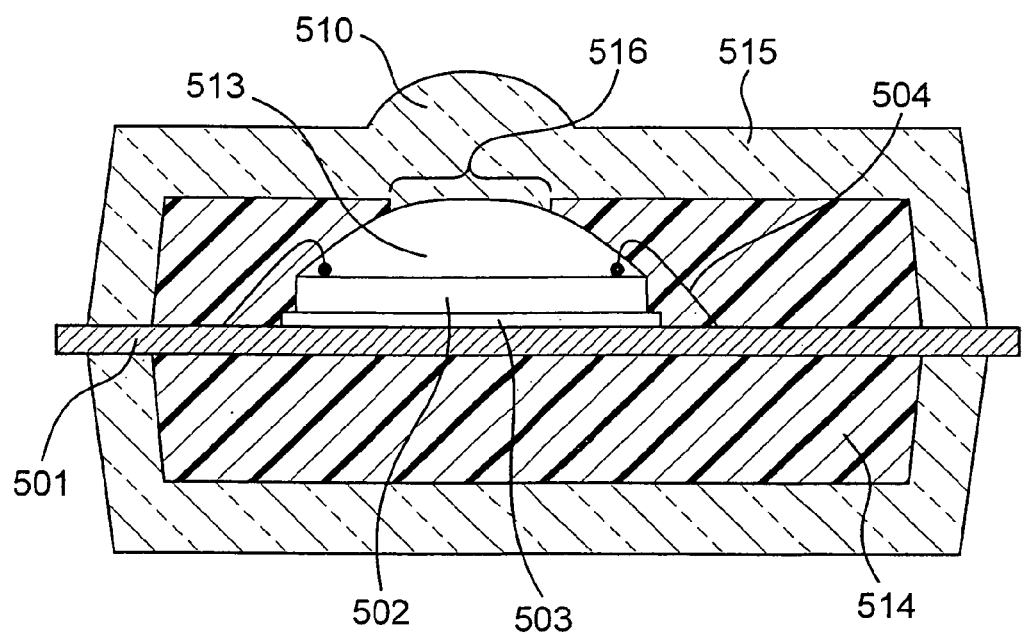
FIG. 22A is a sectional view of another optical semiconductor device.

For example, as shown in FIG. 21A, when the amount of the silicone resin portion 513 with which the optical semiconductor element 502 is coated is small, the depth of the hole portion 516 is deepened. On the other hand, as shown in FIG. 22A, when the amount of the silicone resin portion 513 with which the optical semiconductor element 502 is coated is large, the depth of the hole portion 516 is shallowed.

Figure 21B:
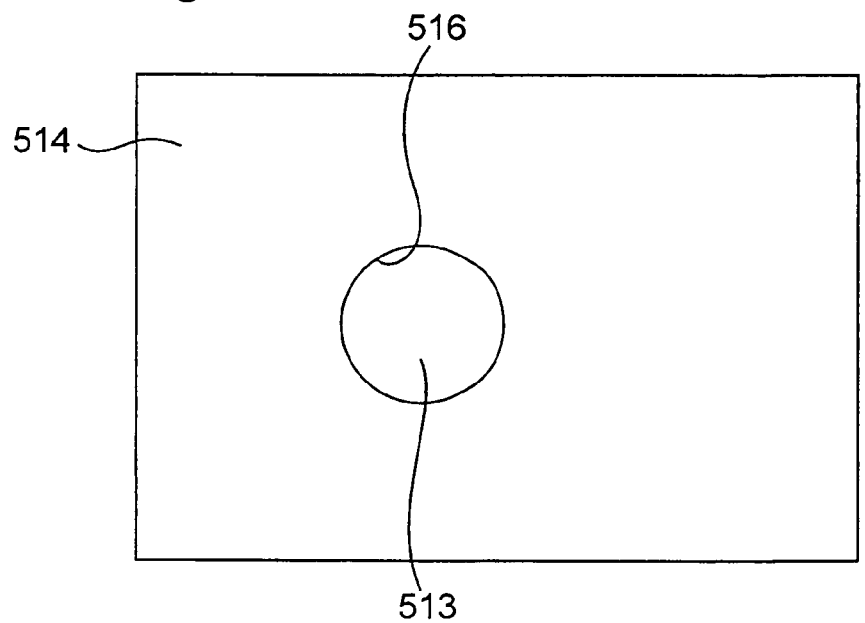
FIG. 21B is a plan view of a first mold resin portion.
Figure 22B:
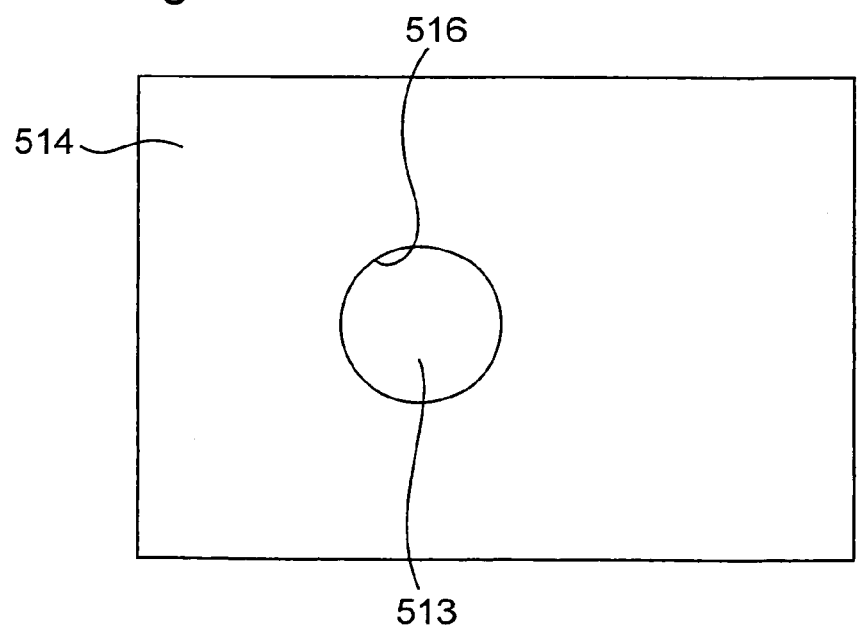
FIG. 22B is a plan view of a first mold resin portion.

However, the size of the aperture diameter of the hole portion 516 when the amount of the silicone resin portion 513 is small (FIG. 21A) as shown in FIG. 21B is the same as the size of the aperture diameter of the hole portion 516 when the amount of the silicone resin portion 513 is large (FIG. 22A) as shown in FIG. 22B.

Therefore, since the size of the aperture diameter of the hole portion 516 can be made definite regardless of the amount of the silicone resin portion 513, an optical path of a definite size can be formed and a definite quantity of light can be obtained when a plurality of optical semiconductor devices are fabricated.

In short, the quantity of light from the optical semiconductor element 502 to the optical fiber cable 511 or the quantity of light from the optical fiber cable 511 to the optical semiconductor element 502 depend on the size and shape of the silicone resin portion 513 when the silicone resin portion 513 is merely covered with the first mold resin portion 514 (or the second mold resin portion 515).

However, by encapsulating the other portion of the silicone resin portion 513 excluding the part of the silicone resin portion 513 with the first mold resin portion 514 while securing the hole portion 516 as in the present invention, the quantity of light from the optical semiconductor element 502 to the optical fiber cable 511 or the quantity of light from the optical fiber cable 511 to the optical semiconductor element 502 does not depend on the size and shape of the silicone resin portion 513 but depend on the size and shape of the aperture of the hole portion 516.

The optical semiconductor device of the twenty-sixth embodiment may be applied to the optical semiconductor devices of the first through twenty-fifth embodiments.

Twenty-Seventh Embodiment

Figure 23A:
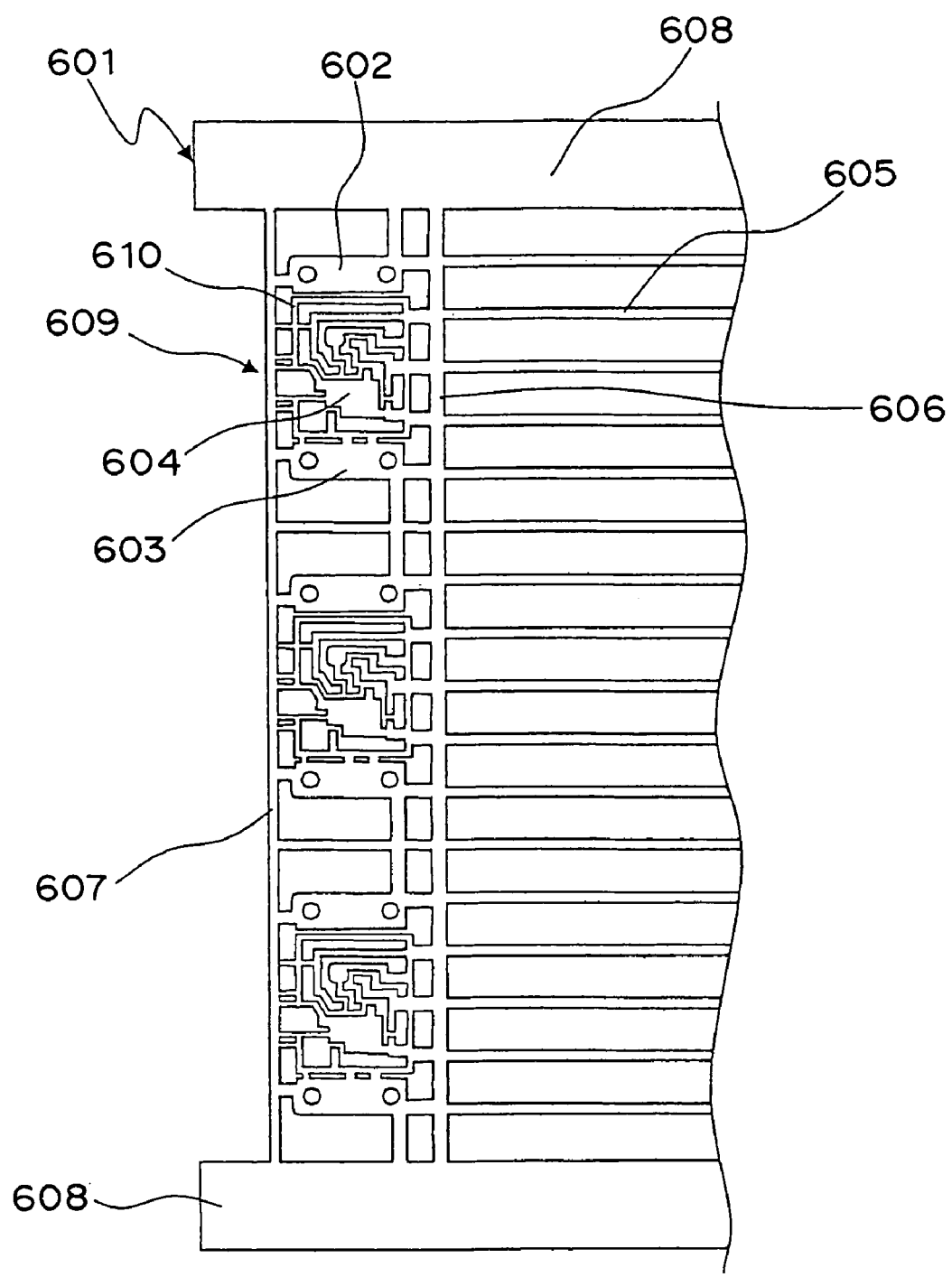
FIG. 23A is a sketch view of a lead frame of the present invention.

FIG. 23A shows a sketch view of a lead frame 601 of one embodiment of the present invention, including two cradle portions 608 and 608 arranged about parallel to each other at a regular interval, mounting fins 602 and 603, a header portion 604, a lead terminal 605, a second tie bar 606 that connects the lead terminals 605 together and a second tie bar 607 that concurrently serves as a support frame. Further included are a gate portion 609 for injecting a resin and a first tie bar 610 for damming up a primary resin in a primary molding process.

Figure 23B:
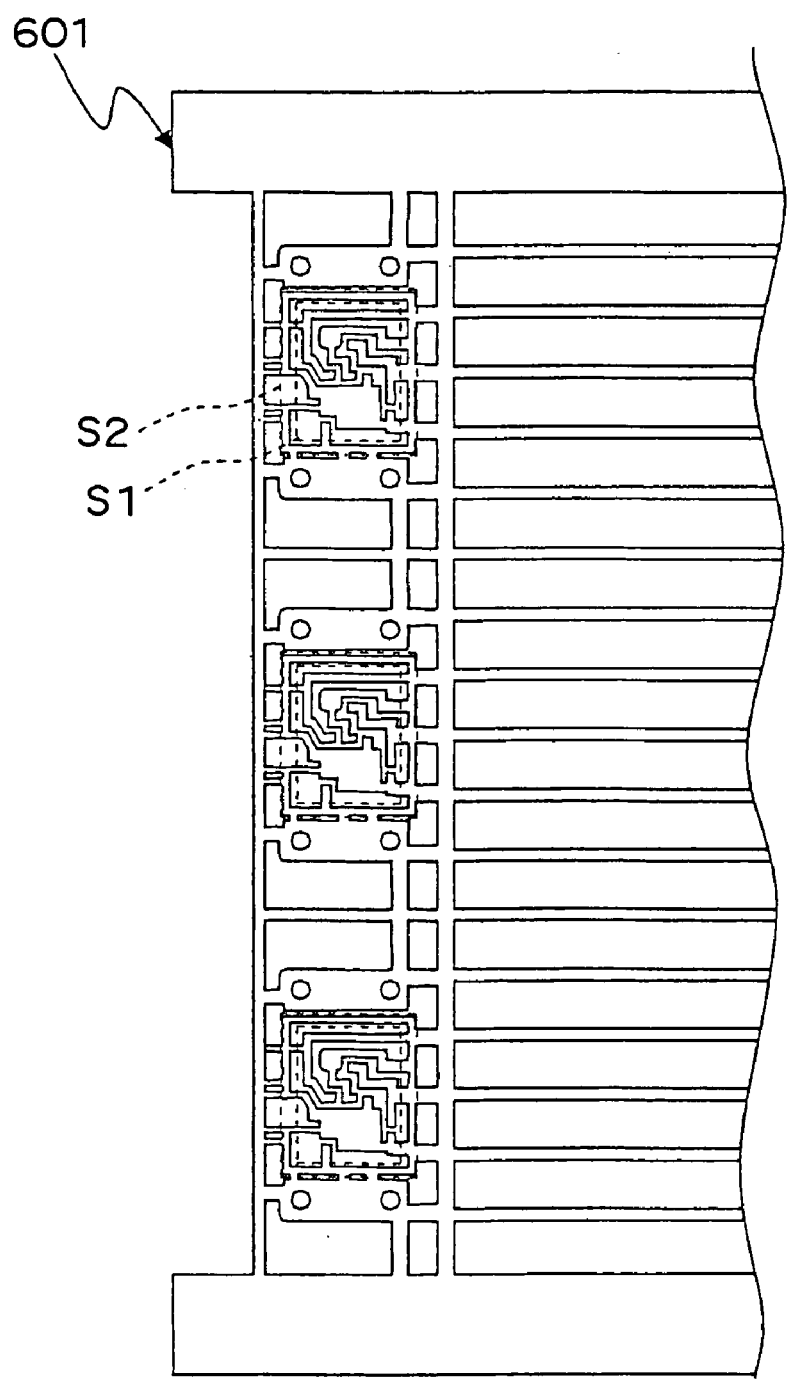
FIG. 23B is a sketch view of the lead frame.

As shown in FIG. 23B, the first lead frame 601 is constructed so that an inner resin portion made of the primary resin is formed in a primary mold region S1, and an outer resin portion made of a secondary resin is formed in a second mold region S2.

FIGS. 24A through 24D show views for explaining a method for fabricating the optical semiconductor device that employs the lead frame 601.

Figure 24A:
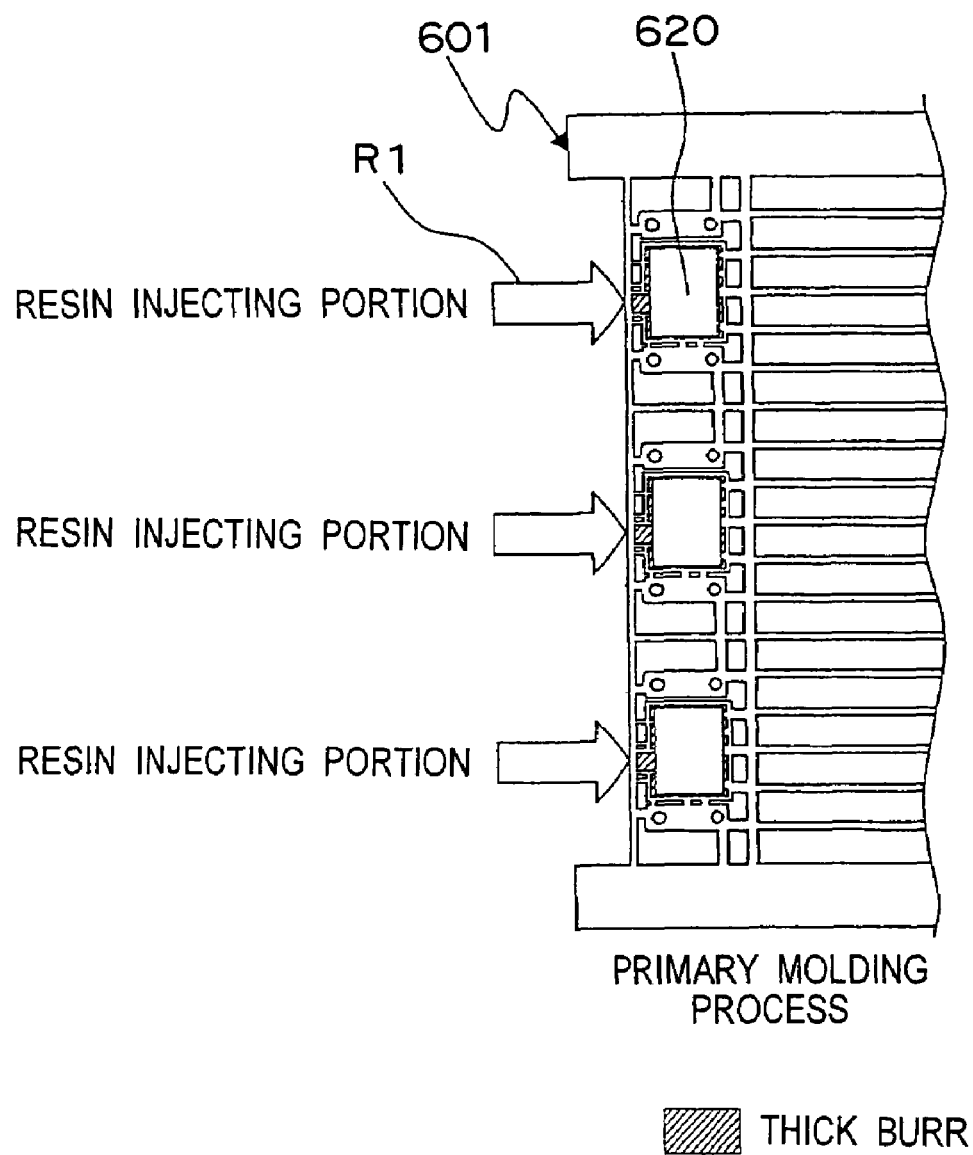
FIG. 24A is a first process chart for explaining a method for fabricating an optical semiconductor device that employs the lead frame.

As shown in FIGS. 24A through 24D, the mounting fins are provided at the right and left (at the top and bottom in FIGS. 24A through 24D) of a region that becomes a package, and therefore, the resin is injected from the gate portion 609 of FIG. 24A in the case of resin encapsulating.

Figure 24B:
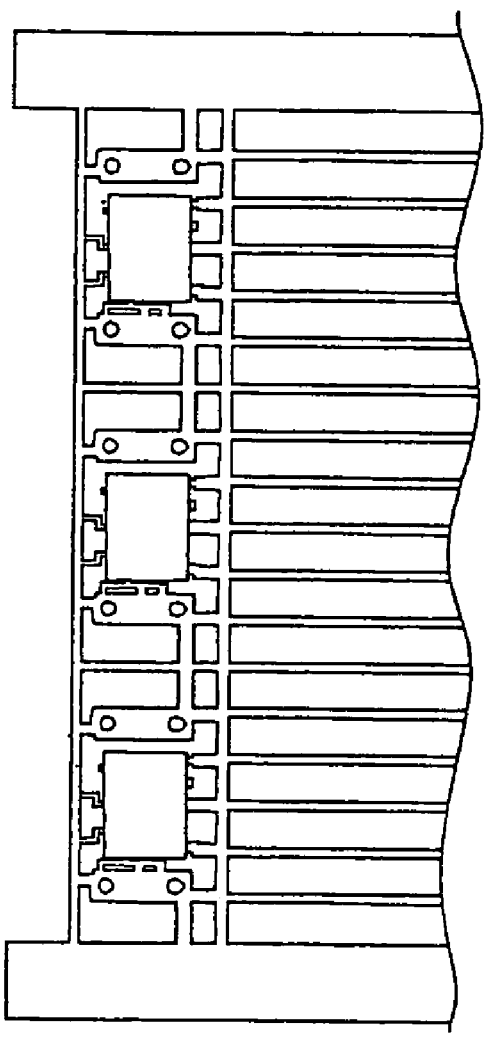
FIG. 24B is a second process chart for explaining a method for fabricating an optical semiconductor device that employs the lead frame.

First of all, an inner resin portion 620 is formed by carrying out the primary molding process in FIG. 24A, and a primary tie bar cutting process is carried out in FIG. 24B. Subsequently, an outer resin portion 630 is formed by carrying out a secondary molding process in FIG. 24C, and a second gate member cutting process is carried out in FIG. 24D.

Figure 24C:
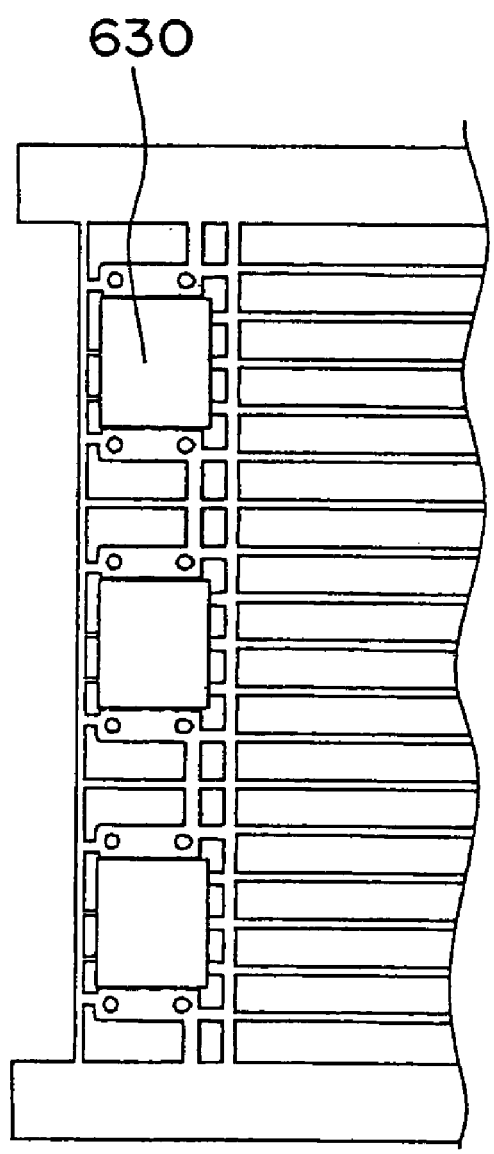
FIG. 24C is a third process chart for explaining a method for fabricating an optical semiconductor device that employs the lead frame.
Figure 24D:
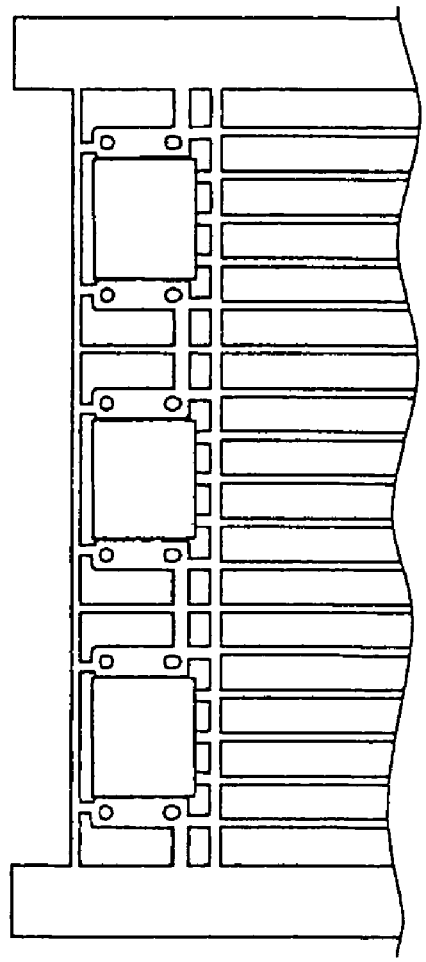
FIG. 24D is a fourth process chart for explaining a method for fabricating an optical semiconductor device that employs the lead frame.
Figure 25:
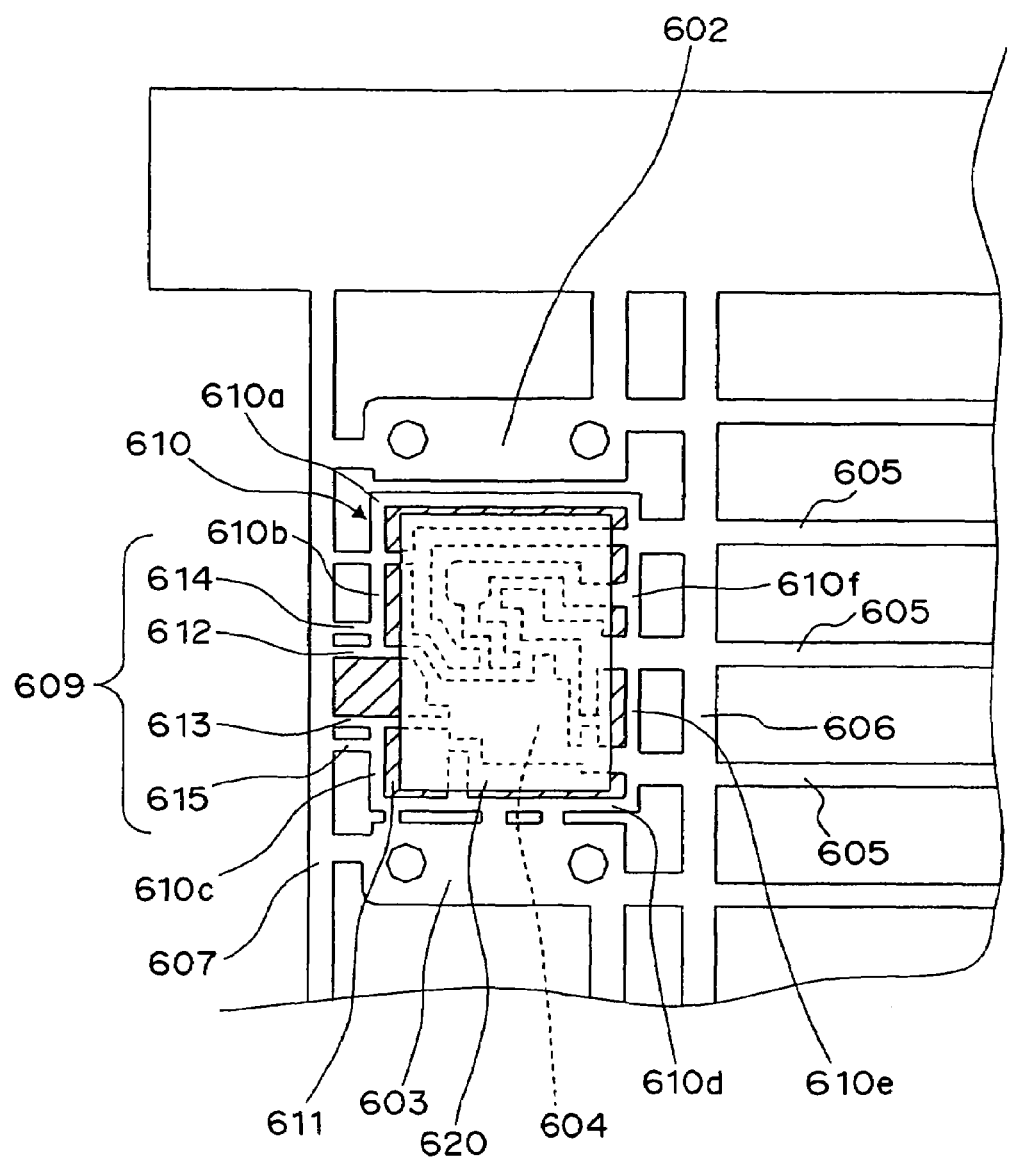
FIG. 25 is an enlarged view of the essential part of the fabricating process shown in FIG. 24A.
Figure 26:
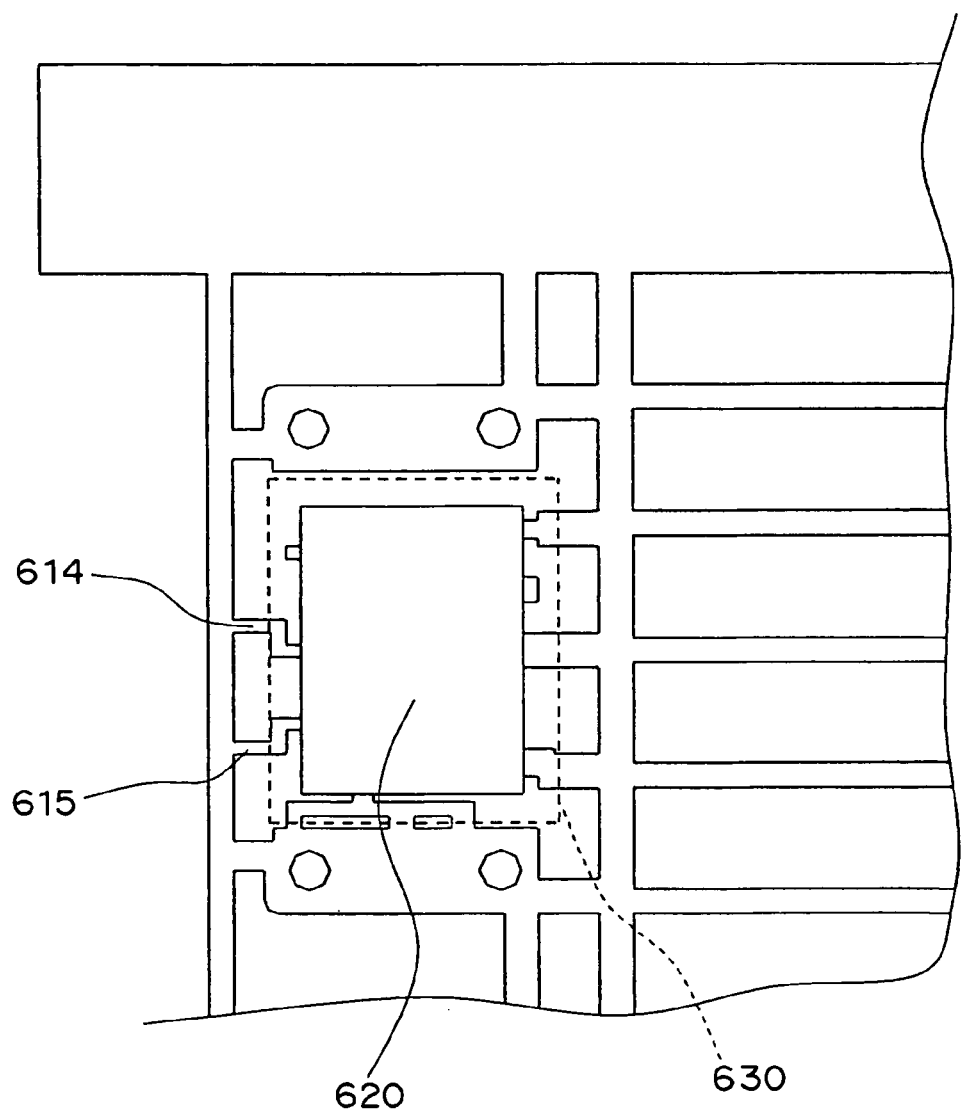
FIG. 26 is an enlarged view of the essential part of the fabricating process shown in FIG. 24B.
Figure 27:
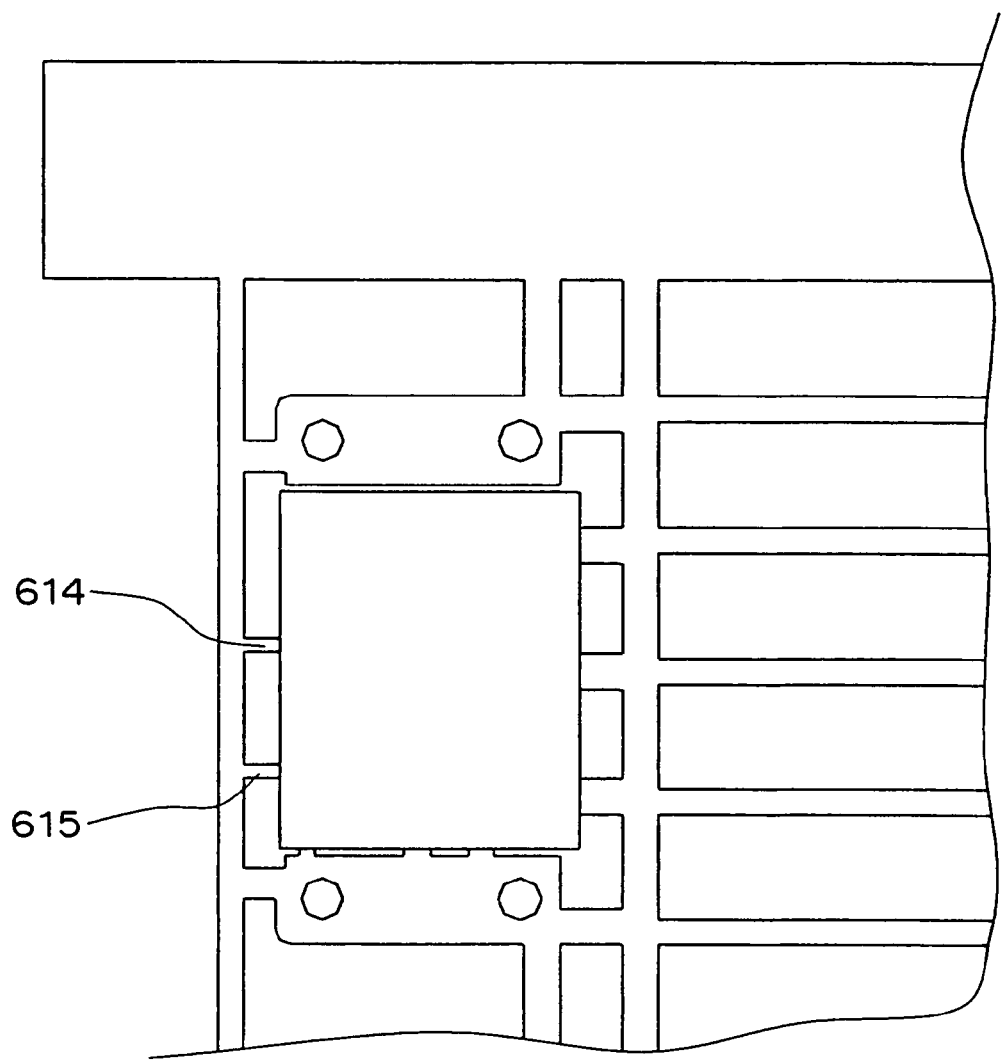
FIG. 27 is an enlarged view of the essential part of the fabricating process shown in FIG. 24C.
Figure 28:
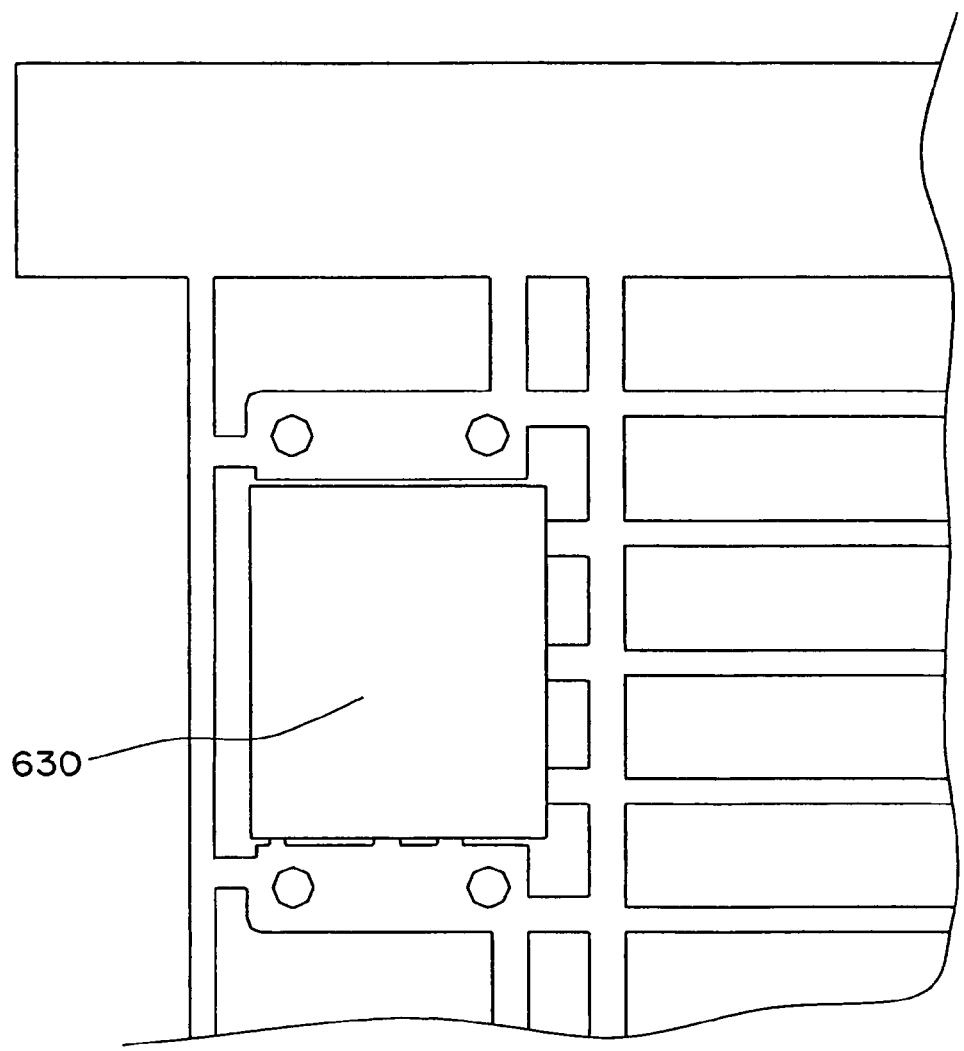
FIG. 28 is an enlarged view of the essential part of the fabricating process shown in FIG. 24D.

FIG. 25 is an enlarged view of the essential part of the fabricating process shown in FIG. 24A. FIG. 26 is an enlarged view of the essential part of the fabricating process shown in FIG. 24B. FIG. 27 is an enlarged view of the essential part of the fabricating process shown in FIG. 24C. FIG. 28 is an enlarged view of the essential part of the fabricating process shown in FIG. 24D.

In FIG. 25, the gate portion 609 for injecting the resin has a dual structure that has two first gate members 612 and 613 that interpose the gate region therebetween at a prescribed interval and two second gate members 614 and 615 that interpose the two first gate members 612 and 613 therebetween on the outer side. The first tie bar 610 is constructed of portions 610a through 610f provided to surround the primary mold region S1 that becomes the inner resin portion 620. The portions 610a through 610f, the lead terminals 605 located between the portions, the second gate members 614 and 615 and the mounting fin 603 become continuous excluding the gate region of the gate portion 609, by which the primary resin is dammed up.

In the case of the dual mold type, as shown in FIG. 24A, the primary resin is injected by transfer molding from an injecting portion (arrow R1), forming the inner resin portion 620. At this time, as shown in FIG. 25, the resin injected from the gate region formed of the first gate members 612 and 613 is dammed up by the first tie bar 610, and a thick burr 611 is formed in a cavity located between the first tie bar 610 and the inner resin portion 620. However, the primary resin does not flow around the lead terminals 605 and the mounting fins 602 and 603.

Further, as shown in FIG. 26, the thick burr 611 and the first tie bar 610 shown in FIG. 25 are removed by a metal mold, leaving the second gate members 614 and 615. In the primary tie bar cutting process, the exposure of the suspension pin to the outside is eliminated by cutting all the suspension pins (e.g., 616 of FIG. 25) connected to the inner lead portion, so that a further improvement in the reliability can be achieved. If the suspension pins are exposed to the outside when the secondary molding process of FIG. 24C is completed, moisture and the like easily enter from the portions.

The secondary resin is injected from the gate region formed of the second gate members 614 and 615 by transfer molding in the state shown in FIG. 26, forming the outer resin portion 630 that surrounds the inner resin portion 620 as shown in FIG. 27. At this time, the secondary resin is dammed up by the second tie bars 606 and 607. Moreover, since the primary resin does not adhere to the lead terminal 605 and the mounting fins 602 and 603, the secondary resin does not convolve the primary resin. Furthermore, since the gate portion 609 has the dual structure having the first and second gate members 612 through 615, the primary resin can also be prevented from flowing from the portion.

Then, as shown in FIG. 28, the second gate members 614 and 615 (shown in FIG. 27) are cut.

As a result, an optical semiconductor device, which has high transparency and satisfactory characteristics, can be provided.

When an optical semiconductor device for optical communications is fabricated by using the fabricating method of the optical semiconductor device of the embodiment, a light-emitting element and a light-receiving element not shown are individually die bonded (stuck) to the header portion of the lead frame 601.

Then, wire bonding for connecting the electrodes of the light-emitting element and the light-receiving element with the lead terminals via gold wires is carried out, and thereafter, the light-emitting element and the light-receiving element are coated with a silicone resin. Through these processes, a window that transmits light is provided after the primary molding process.

Subsequently, primary molding is carried out with a translucent epoxy resin as one example of the primary resin, and thereafter, transfer molding of the whole body is carried out with a translucent epoxy resin as one example of the secondary resin.

Then, the optical semiconductor device, which has undergone the transfer molding, is subjected to the processes of exterior plating, lead forming (outer lead processing), electrical characteristic inspection (measurement of various electric characteristics), marking, visual inspection and packing and becomes a product. As a molding means in this case, injection molding or casting molding may be used for the molding besides the transfer molding.

In the optical semiconductor device for optical communications, the resin flash and the thick burrs between the leads and the thick burrs between the cavities generated when the primary resin encapsulating is carried out are removed with the dummy lead by a metal mold.

Figure 29A:
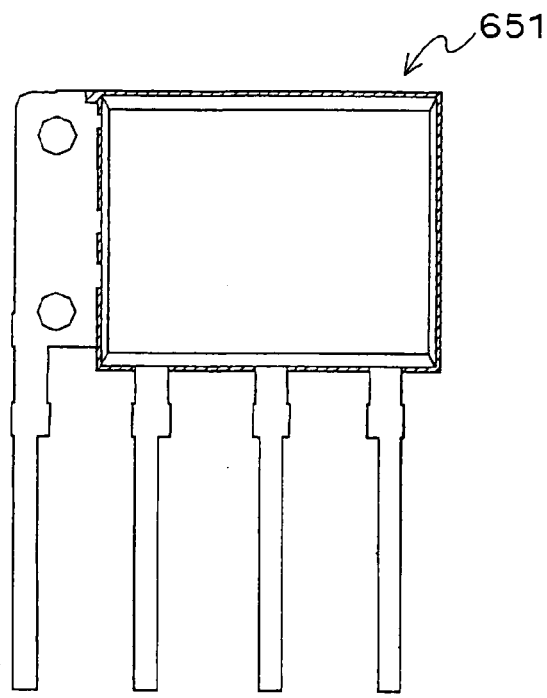
FIG. 29A is a sketch view of an optical semiconductor device that has one mounting fin.
Figure 29B:
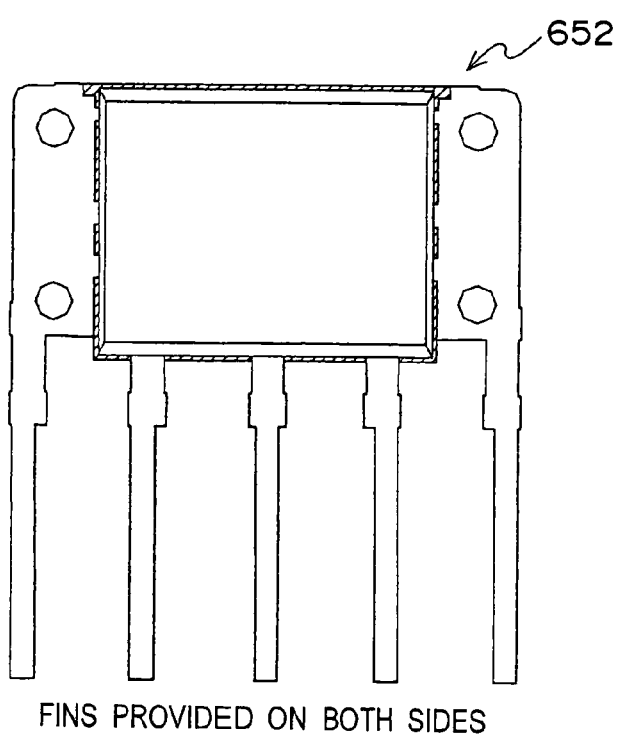
FIG. 29B is a sketch view of an optical semiconductor device that has two mounting fins.

FIG. 29A shows a sketch view of an optical semiconductor device 651 that has one mounting fin fabricated by the fabricating method of the optical semiconductor device. FIG. 29B shows a sketch view of an optical semiconductor device 652 that has two mounting fins on the right and left sides of the package.

According to the lead frame 601 of the construction, the primary resin is injected from the gate region placed between the first gate members 612 and 613 of the gate portion 609, forming the inner resin portion 620 that surrounds the header portion 604. Subsequently, the first gate members 612 and 613 are removed, and the secondary resin is injected from the gate region placed between the second gate members 614 and 615 of the gate portion 609, allowing the outer resin portion 630 to be formed. Therefore, a lead frame, of which the primary resin is not convolved in the outer resin portion 630 in the neighborhood of the gate portion 609 even in the case of a package that does not permit resin encapsulating of a through gate system or the like and is optimum for use in the optical semiconductor device for optical communications, is provided.

Moreover, the second mold region, where the inner resin portion 620 that surrounds the header portion 604 is formed, is surrounded by the first tie bar 610, so that the occurrence of the resin flash in the lead terminals, the fin portions and so on can be prevented when the inner resin portion 620 is formed, and the resin can be prevented from flowing around the second tie bars 606 and 607, the lead terminals, the fin portions and so on when the outer resin portion 630 is formed.

Moreover, the inner lead portion can be retained by the suspension pin 616 and prevented from being deformed at the time of die bonding and wire bonding. Moreover, the same thing can be said for the case where the suspension pin is connected to the header portion.

Moreover, according to the fabricating method of the optical semiconductor device, and an optical semiconductor device, which is able to prevent the resin flash from occurring at the outer terminals, the fin portions and so on and does not convolve the primary resin in the second mold portion even in the case of a package that does not permit the resin encapsulating of through gate type or the like and is appropriate for optical communications, can be provided.

Moreover, by punching the first tie bar 610 of the lead frame after the primary molding process and before the secondary molding process, the resin flash occurring in the primary molding process can be removed together with the first tie bar 610.

Moreover, since the suspension pin is not exposed to the outside when the secondary molding process is completed, moisture and the like do not enter from the portion, and reliability can be improved.

Although the fabricating method of the optical semiconductor device that employs the lead frame has been described in the embodiment, the lead frame of the present invention may be applied to another semiconductor device of the dual mold type without being limited to the optical semiconductor device (e.g., the optical semiconductor devices of the first through twenty-sixth embodiments).

Twenty-Eighth Embodiment

Figure 30:
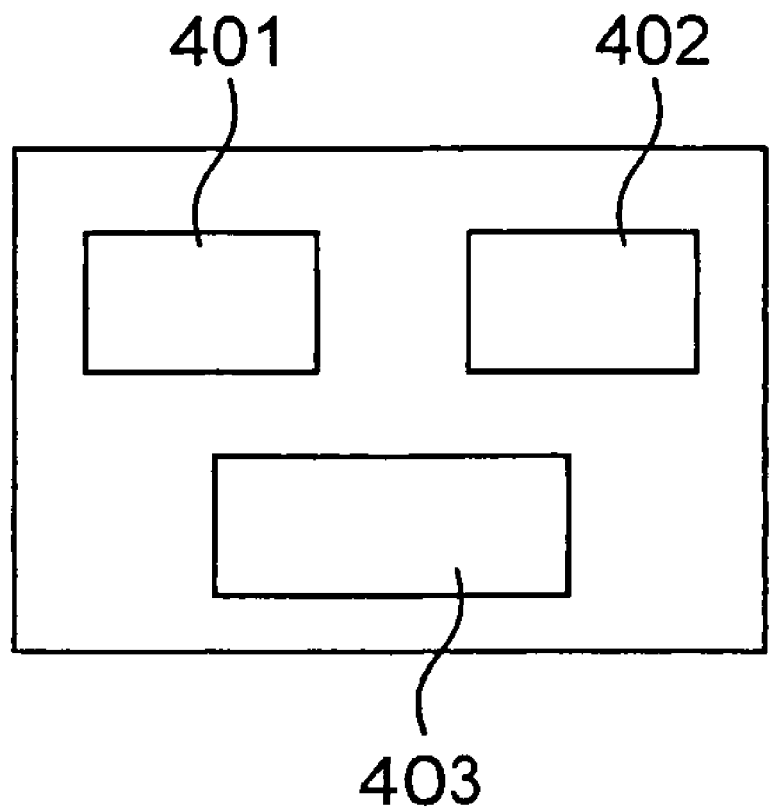
FIG. 30 is a block diagram showing electronic equipment of the present invention.
Figure 31:
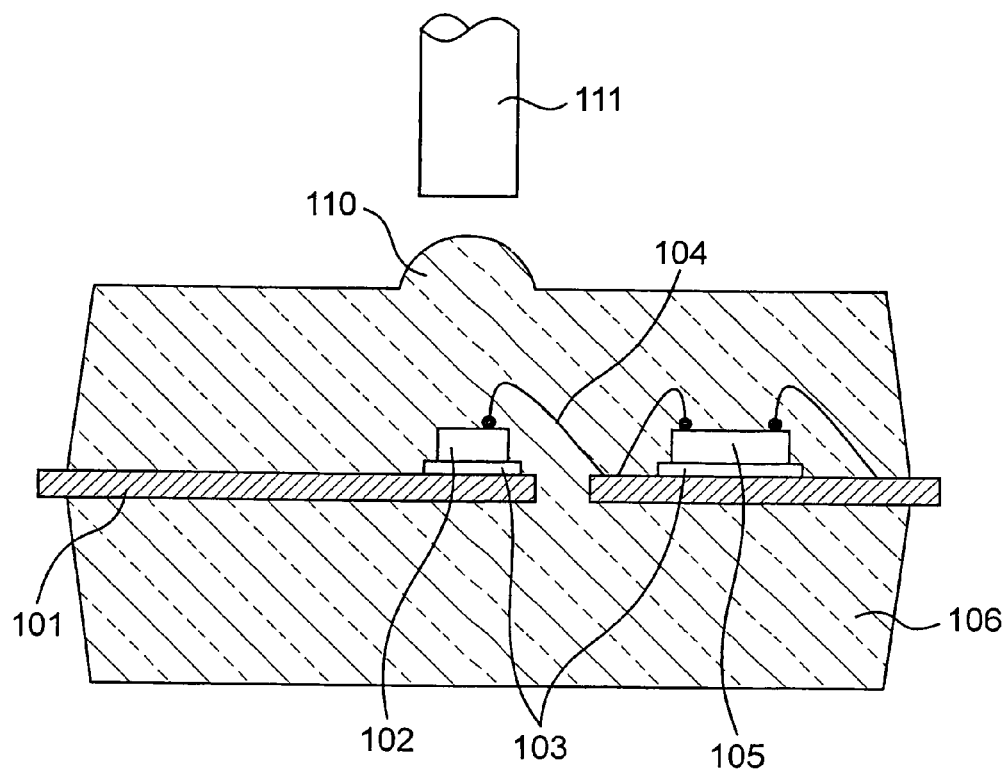
FIG. 31 is an explanatory view schematically showing the construction of an optical semiconductor device that uses a conventional typical transparent resin.
Figure 32:
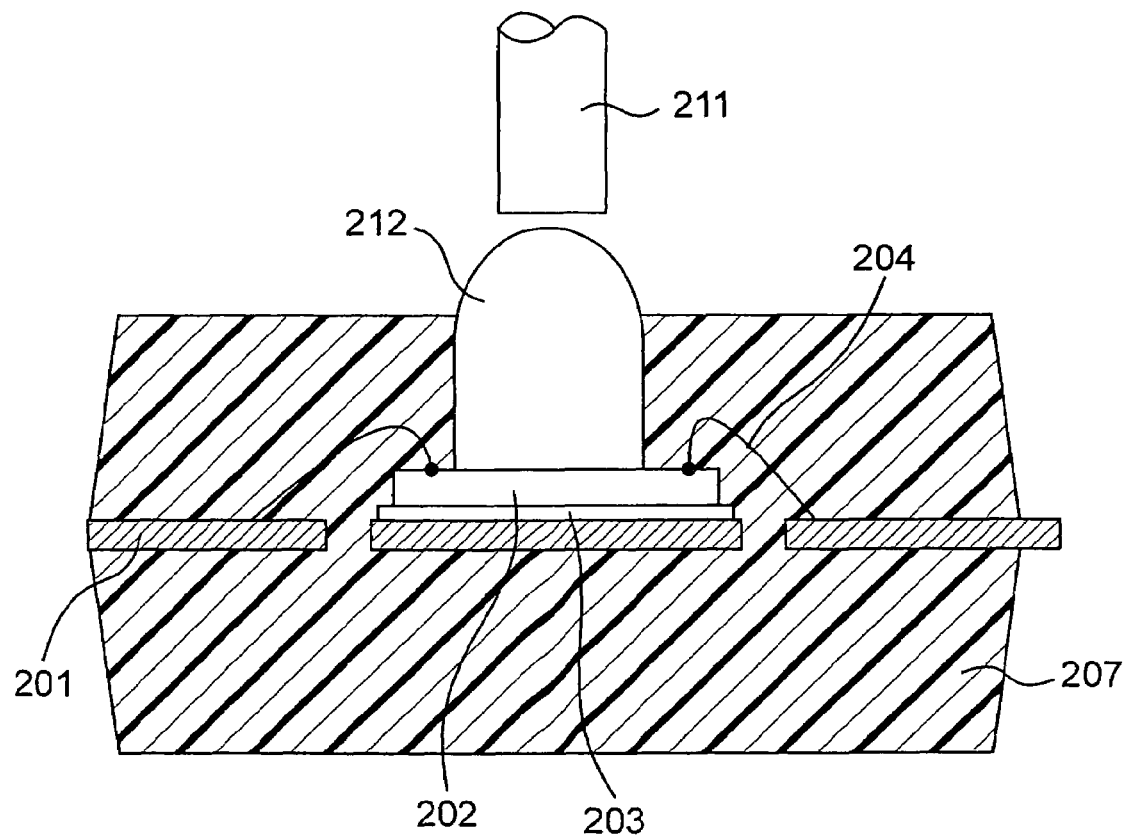
FIG. 32 is an explanatory view schematically showing the construction of an optical semiconductor device that uses a conventional typical resin with incorporated filler.
Figure 33:
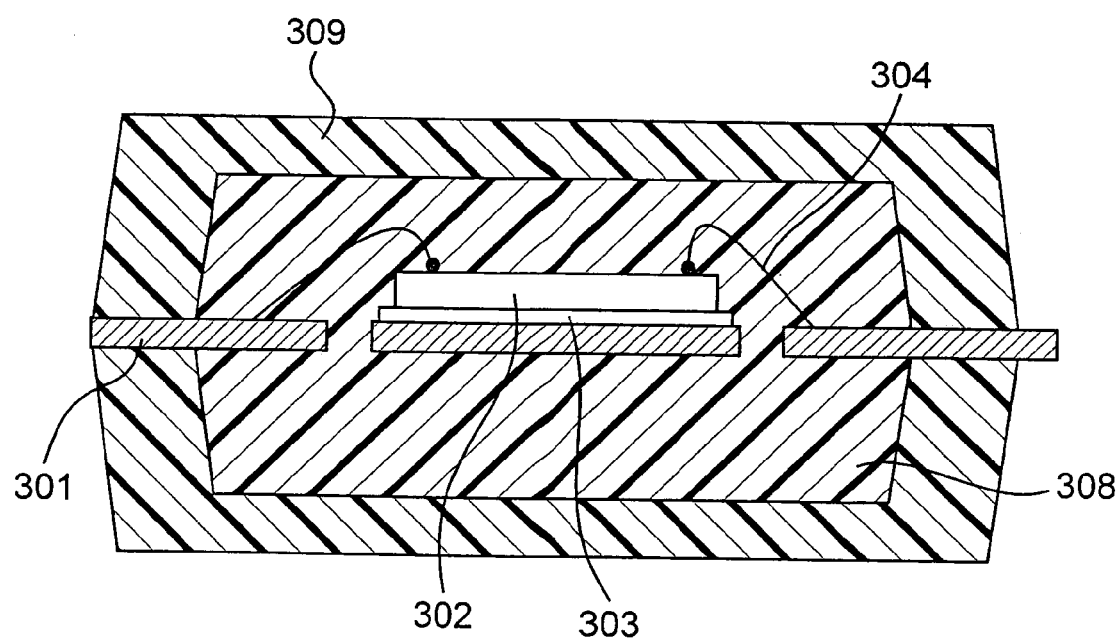
FIG. 33 is an explanatory view schematically showing the construction of a semiconductor device that uses a conventional typical resin encapsulating technique.

FIG. 30 is a block diagram of a ranging sensor as one example of the electronic equipment of the present invention. The ranging sensor has two optical semiconductor devices described in any one of the first through twenty-seventh embodiments. It is noted that one optical semiconductor device 401 employs a light-emitting element as the optical semiconductor element, and the other optical semiconductor device 402 employs a light-receiving element as the optical semiconductor element. Further, the ranging sensor includes an operating section 403.

Then, by applying light to an object to be detected from the optical semiconductor device 401 that includes the light-emitting element, receiving light reflected on the object to be detected by the optical semiconductor device 402 that includes the light-receiving element and calculating the light reception signal by the operating section 403, a distance to the object to be detected is obtained.

According to the electronic equipment, high-quality inexpensive electronic equipment can be fabricated by employing the optical semiconductor device that has a high reliability and a satisfactory optical transmission quality.

In recent years, cost competitiveness of the electronic equipment provided with an optical semiconductor device (digital TV, digital BS tuner, CS tuner, DVD player, CD player, AV amplifier, audio device, personal computer, personal computer peripherals, portable telephone, PDA, etc.) has been severe, and there is a growing severity of the demand for reducing the prices of the components to be mounted.

Moreover, an increasing number of optical semiconductor devices have been equipped for electronic devices, of which the operating temperature ranges are severe, for car audio and car navigation for onboard uses, sensors, control devices, robot sensors for factory automation uses, control devices and so on.

The present invention, which can provide a highly reliable optical semiconductor device of a satisfactory optical transmission quality for the electronic equipment, therefore allows the high-quality inexpensive electronic equipment to be fabricated.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An optical semiconductor device comprising:
a lead frame; an optical semiconductor element placed on the lead frame;
a first mold resin portion that encapsulates the optical semiconductor element;
a second mold resin portion that has light permeability and encapsulates at least part of the first mold resin portion;
a silicone resin portion provided to directly cover the optical semiconductor element, wherein
the first mold resin portion has a coefficient of linear expansion made smaller than a coefficient of linear expansion of the second mold resin portion; and
wherein at least one of the first mold resin portion and the second mold resin portion contains a dyestuff that cuts off light having a shorter wavelength than a light reception wavelength or emission wavelength of the optical semiconductor element.

2. The optical semiconductor device as claimed in claim 1, wherein
the first mold resin portion has light permeability.

3. The optical semiconductor device as claimed in claim 2, wherein
a mold resin filled with filler is used for the first mold resin portion, and a difference between a coefficient of linear expansion of the lead frame and a coefficient of linear expansion of the first mold resin portion is set to 0 to $6.0 \times 10^5$.

4. The optical semiconductor device as claimed in claim 3, wherein
a difference between a coefficient of linear expansion of the first mold resin portion and a coefficient of linear expansion of the second mold resin portion is set to 0 to $6.0 \times 10^5$.

5. The optical semiconductor device as claimed in claim 2, wherein
the first mold resin portion has a transmissivity smaller than a transmissivity of the second mold resin portion.

6. The optical semiconductor device as claimed in claim 2, wherein
a phenolic curing epoxy resin or an acid anhydride curing epoxy resin is used for the first mold resin portion and the second mold resin portion.

7. The optical semiconductor device as claimed in claim 1, wherein the silicone resin portion has a transmissivity greater than a transmissivity of the first mold resin portion and a transmissivity of the second mold resin portion.

8. The optical semiconductor device as claimed in claim 7, wherein the silicone resin portion has cold resistance.

9. The optical semiconductor device as claimed in claim 1, wherein the silicone resin portion has cold resistance.

10. An optical semiconductor device, comprising:
a lead frame; an optical semiconductor element placed on the lead frame;
a first mold resin portion that encapsulates the optical semiconductor element; and
a second mold resin portion that has light permeability and encapsulates at least part of the first mold resin portion, wherein
the first mold resin portion has a coefficient of linear expansion made smaller than a coefficient of linear expansion of the second mold resin portion,
the first mold resin portion has light permeability, and
at least one of the first mold resin portion and the second mold resin portion contains a dyestuff that cuts off light having a shorter wavelength than a light reception wavelength or emission wavelength of the optical semiconductor element.

* * * * *